United States Patent
Chen et al.

(10) Patent No.: US 8,077,443 B2
(45) Date of Patent: Dec. 13, 2011

(54) CAPACITOR STRUCTURE WITH RAISED RESONANCE FREQUENCY

(75) Inventors: Wei-Ting Chen, Tainan County (TW); Chang-Sheng Chen, Taipei (TW); Chin-Sun Shyu, Pingtung County (TW); Chang-Lin Wei, Hsinchu (TW); Cheng-Hua Tsai, Taipei County (TW); Kuo-Chiang Chin, Taipei County (TW)

(73) Assignee: Industrial Technology Research Institute, Hsinchu (TW)

( * ) Notice: Subject to any disclaimer, the term of this patent is extended or adjusted under 35 U.S.C. 154(b) by 806 days.

(21) Appl. No.: 12/109,356

(22) Filed: Apr. 25, 2008

(65) Prior Publication Data
US 2009/0268369 A1 Oct. 29, 2009

(30) Foreign Application Priority Data
Oct. 16, 2007 (TW) ............................... 96138663 A

(51) Int. Cl.
*H01G 4/005* (2006.01)
*H01G 5/01* (2006.01)
(52) U.S. Cl. ....................................... 361/303; 361/278
(58) Field of Classification Search .................. 361/303, 361/271, 278
See application file for complete search history.

(56) References Cited

U.S. PATENT DOCUMENTS

| | | | |
|---|---|---|---|
| 5,079,069 A | 1/1992 | Howard et al. | |
| 5,155,655 A | 10/1992 | Howard et al. | |
| 5,161,086 A | 11/1992 | Howard et al. | |
| 5,261,153 A | 11/1993 | Lucas | |
| 6,657,849 B1 | 12/2003 | Andresakis et al. | |
| 7,102,874 B2 | 9/2006 | Jow et al. | |
| 2007/0217122 A1* | 9/2007 | Gevorgian et al. | 361/307 |
| 2008/0106845 A1* | 5/2008 | Kunimatsu et al. | 361/303 |

FOREIGN PATENT DOCUMENTS
CN 1289451 3/2001

OTHER PUBLICATIONS
"1st Office Action of China Counterpart Application", issued on Oct. 12, 2010, p. 1-p. 5.

* cited by examiner

*Primary Examiner* — Jayprakash N Gandhi
*Assistant Examiner* — Arun Ramaswamy
(74) *Attorney, Agent, or Firm* — Jianq Chyun IP Office

(57) ABSTRACT

A capacitor structure is provided. In the capacitor structure, a signal electrode plate and an extension ground electrode plate are disposed on the same plane to form a co-plane capacitor structure. Due to slow wave characteristic, the resonance frequency of the capacitor structure is effectively raised and the capacitor structure may be applied in high frequency.

7 Claims, 29 Drawing Sheets

CAPACITOR STRUCTURE WITH RAISED RESONANCE FREQUENCY

CROSS-REFERENCE TO RELATED APPLICATION

This application claims the priority benefit of Taiwan application serial no. 96138663, filed on Oct. 16, 2007. The entirety of the above-mentioned patent application is hereby incorporated by reference herein and made a part of specification.

BACKGROUND OF THE INVENTION

1. Field of the Invention

The present invention relates to a co-plane capacitor structure having a signal electrode plate and an extension ground electrode plate both disposed on the same plane.

2. Description of Related Art

Along with the progress in electronic products, products with compact design and multiple functions have dominated the tendency on the market today, where, in particular, compacting parts and modules and lowering the numbers thereof become vital design criteria of new products. Today, the newly emerging embedded passive devices are able to substitute the conventional discrete passive devices, wherein by means of modern macromolecule compound material technology a passive device can be embedded inside a printed circuit board (PCB) by spreading, printing, pressing and etching processes.

In the embedded passive device, capacitors play an important role on dimension and price issues. However, the parasitic effect of conventional capacitors makes the capacitance varied nonlinearly, which reduces the resonance frequency of the capacitor so as to limit the frequency range thereof.

FIG. 1 is a diagram showing the electric characteristic of a capacitor. In FIG. 1, the abscissa represents operation frequency, the ordinate represents impedance of capacitor and the broken line represents resonance frequency Fr of capacitor. When the operation frequency is less that the resonance frequency Fr, the device behaves like capacitor, while when the operation frequency is greater than the resonance frequency Fr, the device behaves like an inductor.

In general, the larger size of a capacitor, the more serious of the parasitic effect thereof, which makes low resonance frequency Fr and narrow applicable range where the device behaving like a capacitor. In this regard, the U.S. Pat. Nos. 5,079,069, 5,155,655, 5,161,086 and 5,261,153 provide several plate capacitor structures suffered by lower resonance frequency and thus narrow applicable range. In addition, the U.S. Pat. Nos. 6,657,849 and 7,102,874 provide plate capacitor structures, which are suffered by limited resonance frequency problem as well.

SUMMARY OF THE INVENTION

Accordingly, the present invention is directed to a co-plane capacitor structure, wherein due to slow wave characteristic, a signal electrode plate and an extension ground electrode plate are disposed together on the same plane to effectively raise the resonance frequency of the capacitor device and thereby application frequency range is wide.

The present invention is also directed to a co-plane capacitor structure, which takes advantage of the electromagnetic wave edge effect to achieve capacitance compensation so as to keep the capacitance without increasing layout area of the capacitor.

The present invention is further directed to a dual-port co-plane capacitor structure, which has advantage of symmetric structure so as to overcome the non-symmetry problem in conventional dual-port plate capacitors.

An embodiment of the present invention provides a single-port capacitor structure, which includes a first electrode plate and a second electrode plate. The first electrode plate includes an opening, the second electrode plate is disposed at a side of the first electrode plate and the second electrode plate and the first electrode plate do not locate on the same plane.

Another embodiment of the present invention provides a single-port capacitor structure, which includes a first electrode plate and a second electrode plate. The first electrode plate includes an opening, and the second electrode plate is disposed in the opening of the first electrode plate and locates on the same plane together with the first electrode plate. One of the first electrode plate and the second electrode plate is virtually grounded.

Yet another embodiment of the present invention provides a dual-port capacitor structure, which includes a first electrode plate, a second electrode plate and a third electrode plate. The first electrode plate and the second electrode plate respectively include a first opening and a second opening, and the third electrode plate is disposed in the first opening and the second opening. The first electrode plate, the second electrode plate and the third electrode plate together locates on the same plane.

Yet another embodiment of the present invention provides a dual-port capacitor structure, which includes a first electrode plate, a second electrode plate and a third electrode plate. The first electrode plate includes a first opening and together with the second electrode plate locates on the same plane, while the third electrode plate and the first electrode plate do not locate on the same plane.

Yet another embodiment of the present invention provides a dual-port capacitor structure, which includes a first signal electrode plate, a second signal electrode plate and a first extension ground electrode plate. The first signal electrode plate, the second signal electrode plate and the first extension ground electrode plate together locate on the same plane.

In the capacitor structures provided by the above-mentioned embodiments of the present invention, since the signal electrode plate and the extension ground electrode plate are disposed on the same plane, a co-plane capacitor structure is formed, which can effectively advance the resonance frequency of the capacitor structure, lower down the parasitic effect of the capacitor structure and widen the applicable frequency range thereof. In addition, by means of electromagnetic wave edge effect, the capacitance coupling loss in the co-plane capacitor structure is able to be compensated to keep capacitance.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
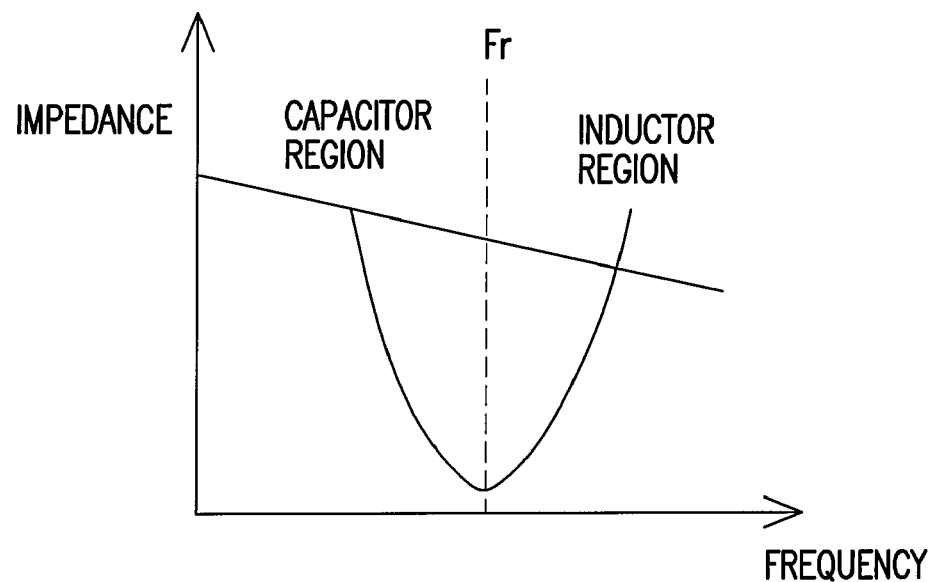
FIG. 1 is a diagram showing the electric characteristic of a capacitor.

Reference will now be made in detail to the present preferred embodiments of the invention, examples of which are illustrated in the accompanying drawings. Wherever possible, the same reference numbers are used in the drawings and the description to refer to the same or like parts.

In the following, the depicted embodiments together with the included drawings are intended to explain the feasibility of the present invention, wherein some of expression words regarding direction or orientation, such as 'upper', 'lower', 'left', 'right', 'over', 'under', 'up from', 'down from', 'somehow low', 'behind', 'front' and the like, are to describe, not to limit, the present invention.

Figure 2A:
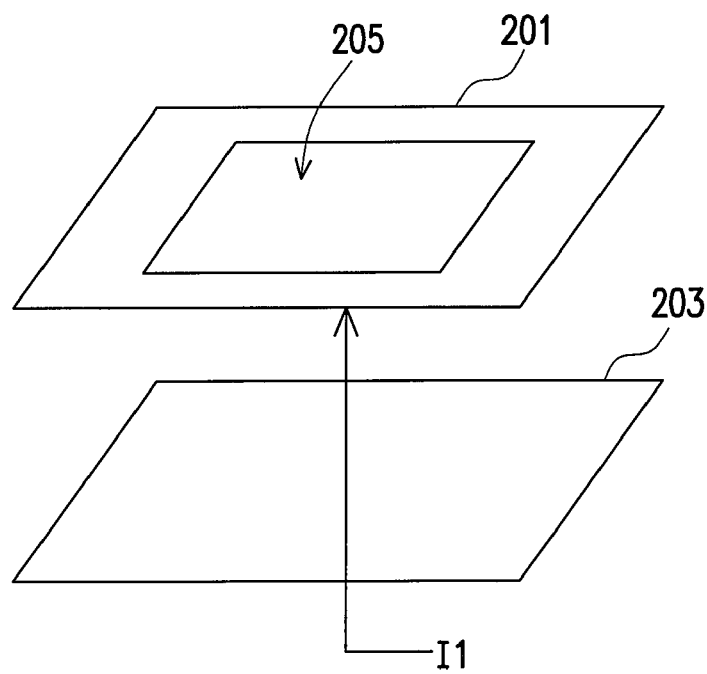
FIG. 2A is a perspective drawing of a single-port capacitor structure according to a first embodiment of the present invention.

FIG. 2A is a perspective drawing of a single-port capacitor structure according to a first embodiment of the present invention. The capacitor structure includes a signal electrode plate 201 and a ground electrode plate 203. An opening 205 is made in the signal electrode plate 201, and the opening 205 is not limited to the rectangle as shown in FIG. 2A, but any shapes, for example, circle or polygon and the like. Note that if the above-mentioned implementation way is applicable to the embodiments hereinafter, the related depictions are omitted in the following embodiments.

The ground electrode plate 203 is disposed under the signal electrode plate 201, so that the signal electrode plate 201 and the ground electrode plate 203 do not locate on the same plane.

In addition, in all embodiments of the present invention and the possible modifications thereof, the electrical properties both of the signal electrode plate and the ground electrode plate are exchangeable one another. For example, once the ground electrode plate is located above, then the signal electrode plate is located below. Moreover, the ground electrode plate is able to have an opening. Note that if the above-mentioned implementation way is applicable to the embodiments hereinafter, the related depictions are omitted in the following embodiments.

Figure 2B:
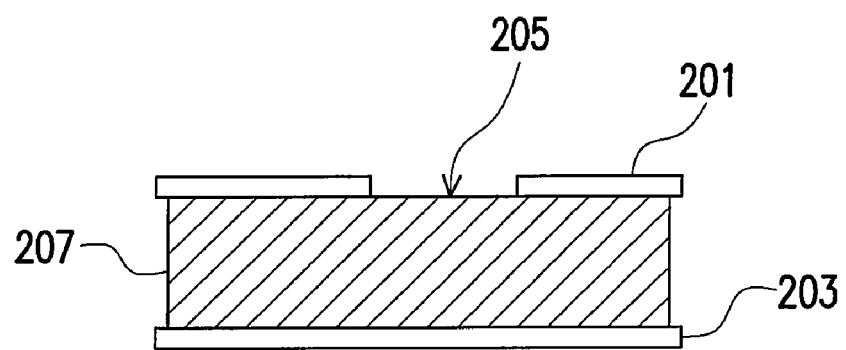
FIG. 2B is a schematic cross section drawing of the single-port capacitor structure in FIG. 2A according to the first embodiment of the present invention.

FIG. 2B is a schematic cross section drawing of the single-port capacitor structure along line I1 in FIG. 2A according to the first embodiment of the present invention. Referring to FIG. 2B, a dielectric layer 207 is disposed between the signal electrode plate 201 and the ground electrode plate 203.

Figure 3A:
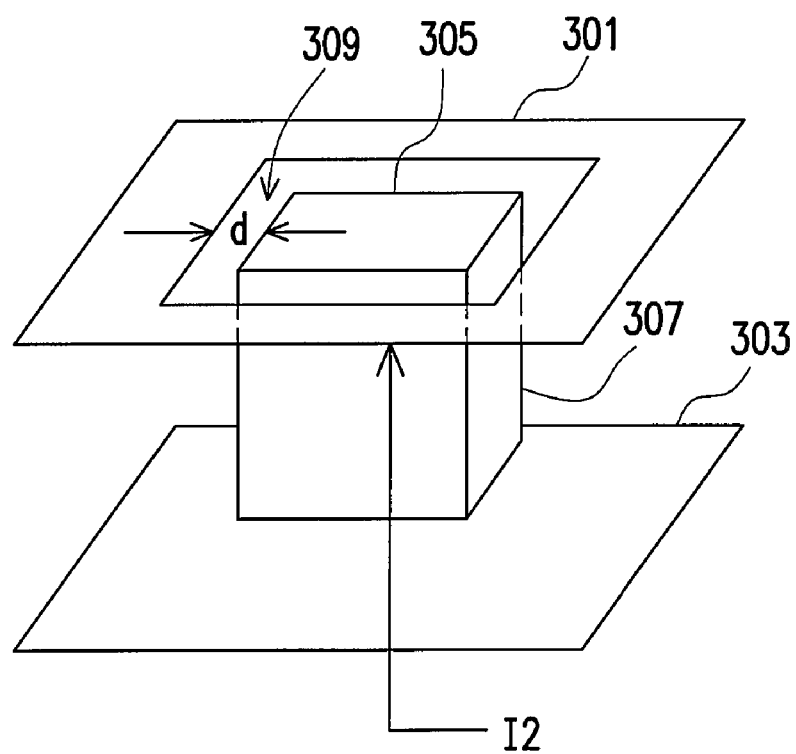
FIG. 3A is a perspective drawing of a single-port capacitor structure according to a second embodiment of the present invention.

FIG. 3A is a perspective drawing of a single-port capacitor structure according to a second embodiment of the present invention. The capacitor structure includes a signal electrode plate 301, a ground electrode plate 303, an extension ground electrode plate 305 and an interconnection 307. An opening 309 is in the signal electrode plate 301. In order to easily simulate the electrical characteristic, the extension ground electrode plate 305 herein is disposed at the center of the opening 309. However, the extension ground electrode plate 305 is not necessarily disposed at the center of the opening 309. In addition, the extension ground electrode plate 305 and the signal electrode plate 301 together locate on the same plane. The edge of the extension ground electrode plate 305 is from the edge of the opening 309 by a distance parameter d, wherein the distance parameter d is in unit of mil (0.001 inch).

The extension ground electrode plate 305 is electrically connected to the ground electrode plate 303 through the interconnection 307. The ground electrode plate 303 is disposed under the signal electrode plate 301, so that the signal electrode plate 301 and the ground electrode plate 303 do not locate on the same plane.

The signal electrode plate 301 and the extension ground electrode plate 305 locate on the same plane, thus, both of them together form a co-plane capacitor structure. The structure is able to provide multiple electromagnetic wave paths to lower down the parasitic effect of the capacitor device and widen the application frequency range thereof. Besides, the electromagnetic wave edge effect is able to compensate the capacitance loss due to a structure variation (for example, the signal electrode plate 301 gets hollow).

Figure 3B:
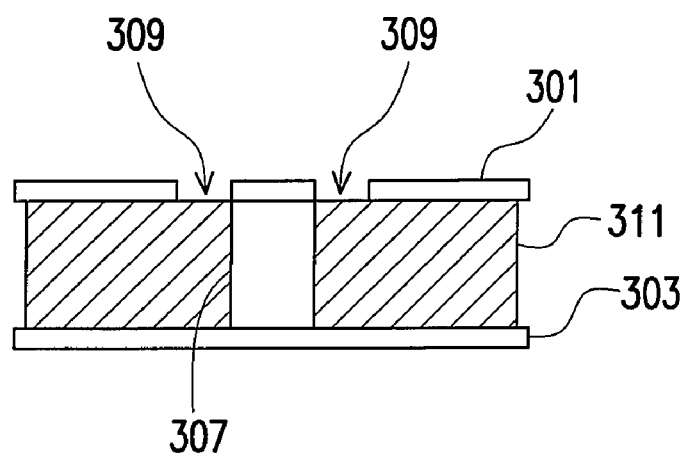
FIG. 3B is a schematic cross section drawing of the single-port capacitor structure in FIG. 3A according to the second embodiment of the present invention.

FIG. 3B is a schematic cross section drawing of the single-port capacitor structure along line 12 in FIG. 3A according to the second embodiment of the present invention. Referring to FIG. 3B, a dielectric layer 311 is disposed between the signal electrode plate 301 and the ground electrode plate 303.

Figure 3C:
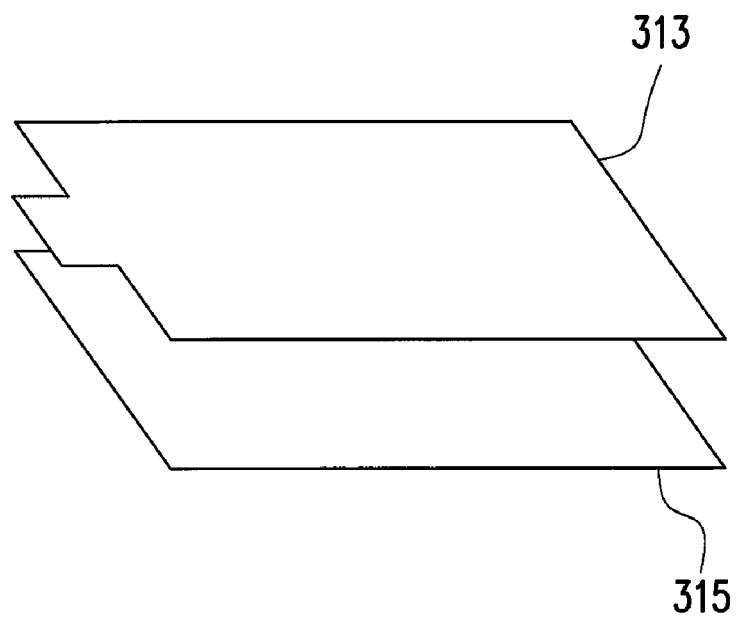
FIG. 3C is a perspective drawing of a conventional single-port capacitor structure.

FIG. 3C is a perspective schematic of a conventional single-port capacitor structure. The capacitor includes a signal electrode plate 313 and a ground electrode plate 315. The signal electrode plate 313 is disposed over the ground electrode plate 315. Referring to FIGS. 3A and 3C, it is clear the signal electrode plate 313 in FIG. 3C has no opening, therefore, the conventional capacitor structure is not counted as a co-plane capacitor structure.

Figure 3D:
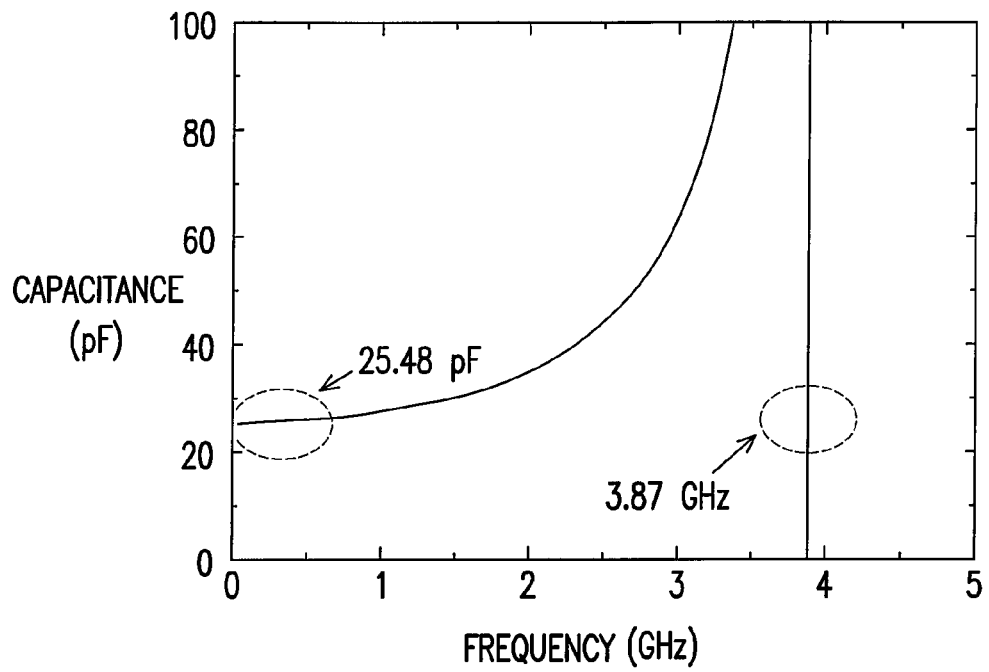
FIG. 3D is a characteristic simulation diagram of the capacitance-frequency characteristic of the conventional single-port plate capacitor in FIG. 3C.
Figure 3E:
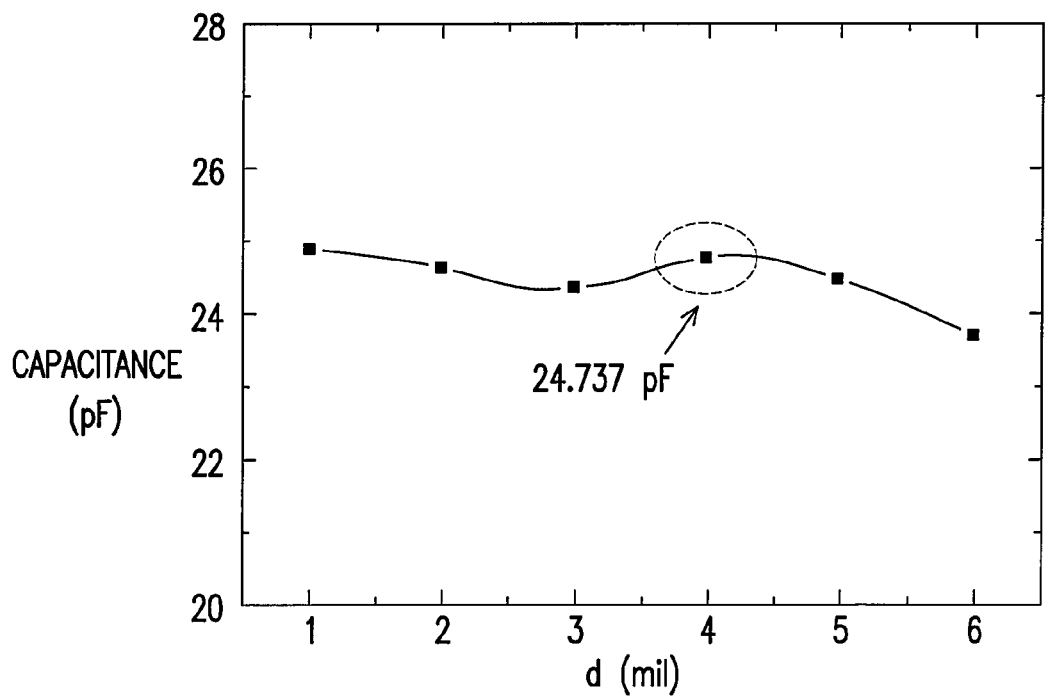
FIG. 3E is a characteristic simulation diagram of the capacitance-distance parameter d characteristic of a single-port co-plane capacitor according to the second embodiment of the present invention.
Figure 3F:
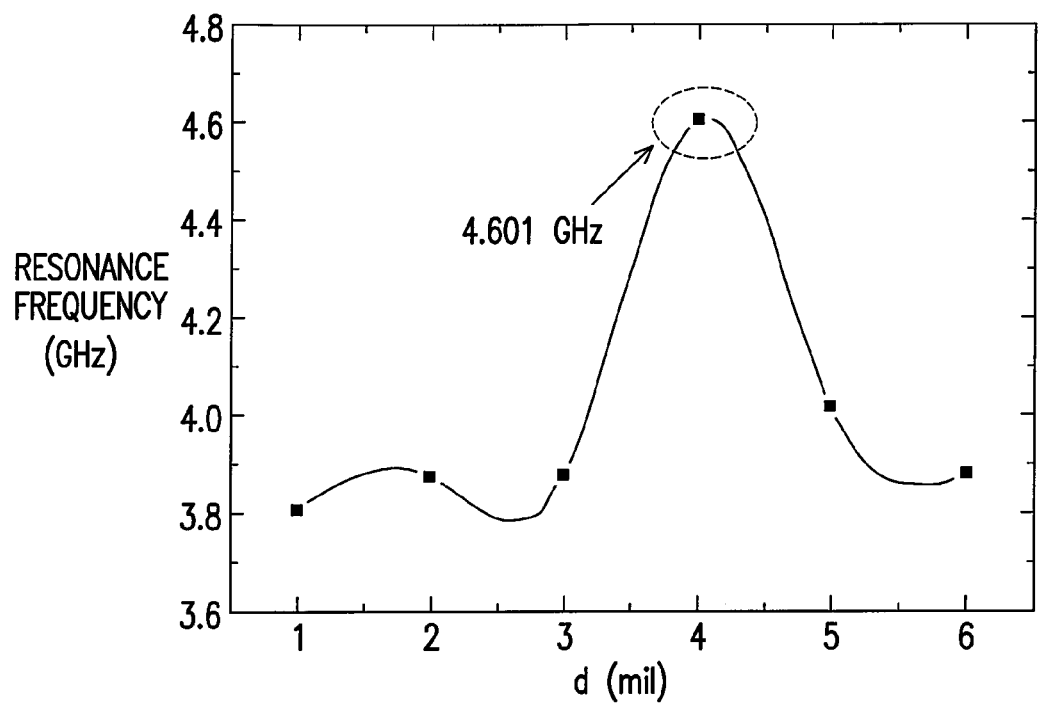
FIG. 3F is a characteristic simulation diagram of the resonance frequency-distance parameter d characteristic of the single-port co-plane capacitor according to the second embodiment of the present invention.

FIG. 3D is a characteristic simulation diagram of the conventional single-port plate capacitor in FIG. 3C, FIG. 3E is a characteristic simulation diagram of the capacitance vs distance parameter of a single-port co-plane capacitor according to the second embodiment of the present invention and FIG. 3F is a characteristic simulation diagram of the resonance frequency vs distance parameter of the single-port co-plane capacitor according to the second embodiment of the present invention. Referring to FIGS. 3D-3F, when the distance parameter d=4 mil, the capacitance of the capacitor structure of the second embodiment of the present invention is near to that of the conventional capacitor structure, but the capacitor structure of the second embodiment of the present invention has a higher resonance frequency than that of the conventional capacitor structure.

The relationships between the distance parameter d, the capacitance and the resonance frequency of the embodiment are listed in the following table. In order to compare with the prior art, the corresponding capacitance and resonance frequency of the conventional capacitor structure are included herein as well.

|  | d |  |  |  |  |  | conventional |
|---|---|---|---|---|---|---|---|
|  | 1 | 2 | 3 | 4 | 5 | 6 | capacitor |
| capacitance (pF) | 24.85 | 24.58 | 24.30 | 24.74 | 24.44 | 23.69 | 25.48 |
| resonance frequency (GHz) | 3.80 | 3.87 | 3.87 | 4.60 | 4.01 | 3.87 | 3.87 |

Figure 4A:
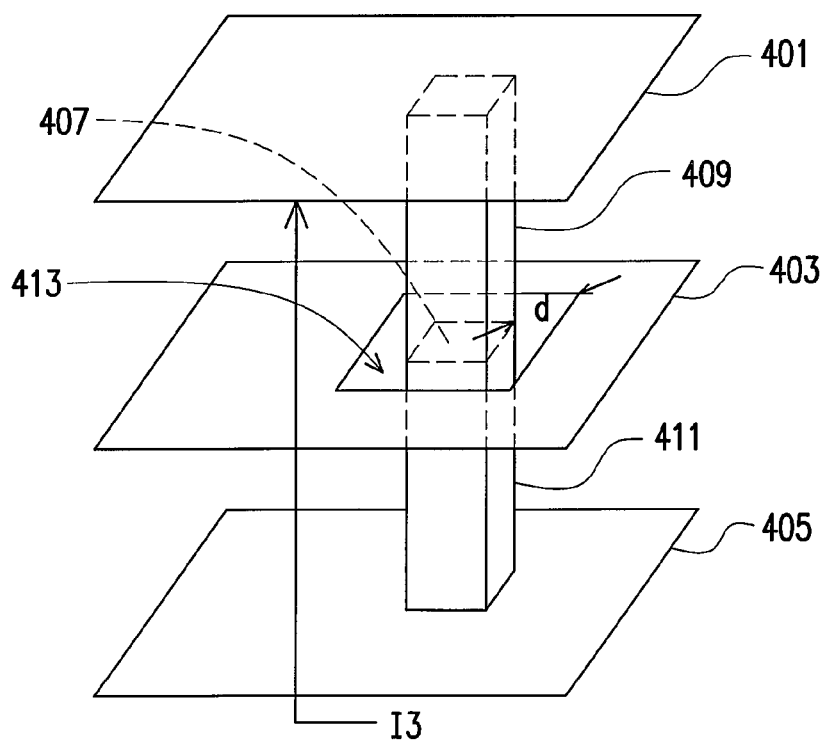
FIG. 4A is a perspective drawing of an embedded multi-layers single-port capacitor structure according to the third embodiment of the present invention.

FIG. 4A is a perspective drawing of an embedded multi-layers single-port capacitor structure according to a third embodiment of the present invention. The capacitor structure includes a signal electrode plate 403, two ground electrode plates 401 and 405, an extension ground electrode plate 407 and two interconnections 409 and 411, and an opening 413 is disposed in the signal electrode plate 403.

The ground electrode plate 401, the signal electrode plate 403 and the ground electrode plate 405 are sequentially arranged from up to down. The extension ground electrode plate 407 is disposed at the center of the opening 413 and with the signal electrode plate 403 together locates on the same plane. In addition, the edge corner of the extension ground electrode plate 407 is from the edge corner of the opening 413 by a distance parameter d, wherein the distance parameter d is in unit of mil (0.001 inch).

The extension ground electrode plate 407 is electrically connected to the ground electrode plates 401 and 405 respectively through the interconnections 409 and 411. In the embodiment, the signal electrode plate 403 and the ground electrode plate 407 together form a co-plane capacitor structure embedded in the capacitor device.

Figure 4B:
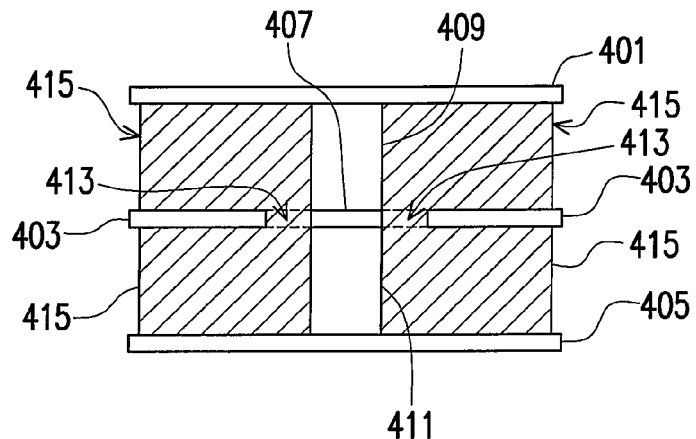
FIG. 4B is a schematic cross section drawing of the embedded multi-layers single-port capacitor structure in FIG. 4A according to the third embodiment of the present invention.

FIG. 4B is a schematic cross section drawing of the embedded multi-layers single-port capacitor structure along line 13 in FIG. 4A according to the third embodiment of the present invention. Referring to FIG. 4B, a dielectric layer 415 is disposed between the signal electrode plate 403 and the ground electrode plate 405.

Figure 4C:
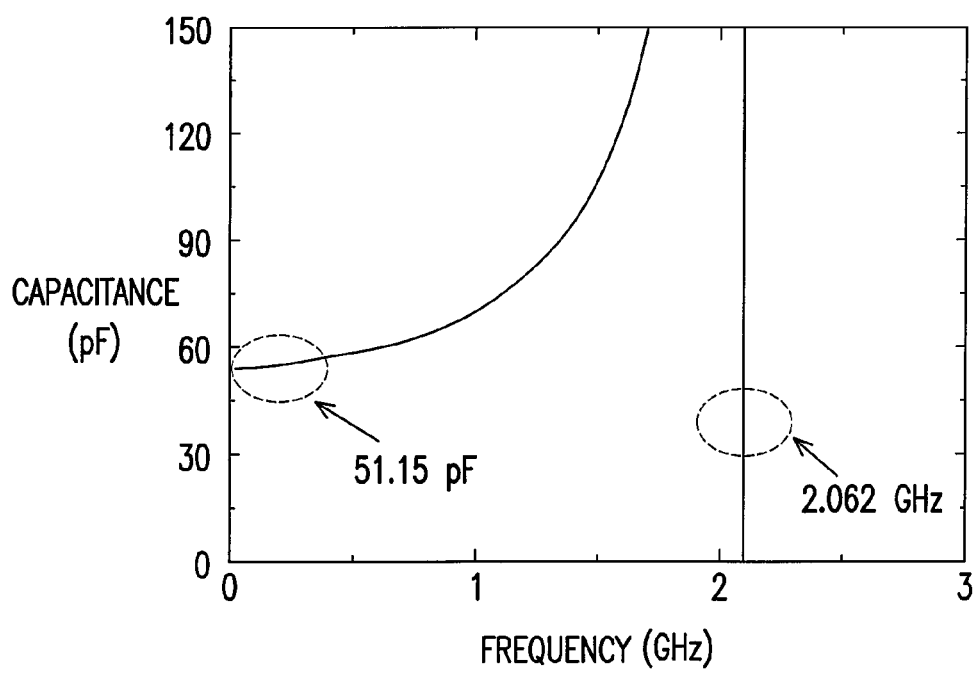
FIG. 4C is a characteristic simulation diagram of the capacitance-frequency characteristic of a conventional embedded multi-layers single-port plate capacitor.
Figure 4D:
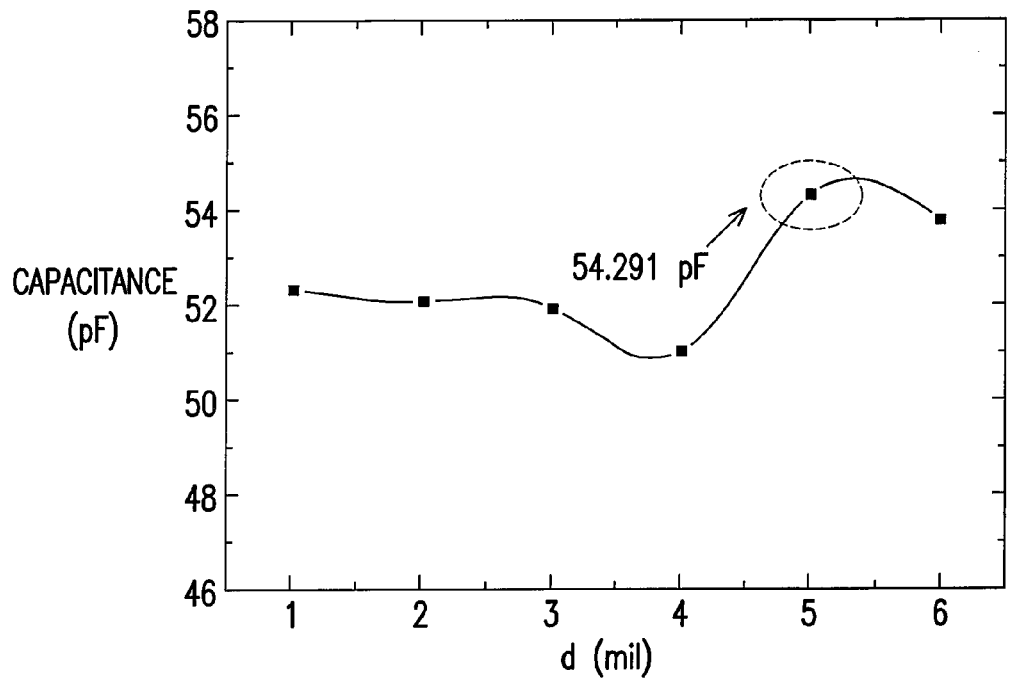
FIG. 4D is a characteristic simulation diagram of the capacitance-distance parameter d characteristic of an embedded multi-layers single-port co-plane capacitor according to the third embodiment of the present invention.
Figure 4E:
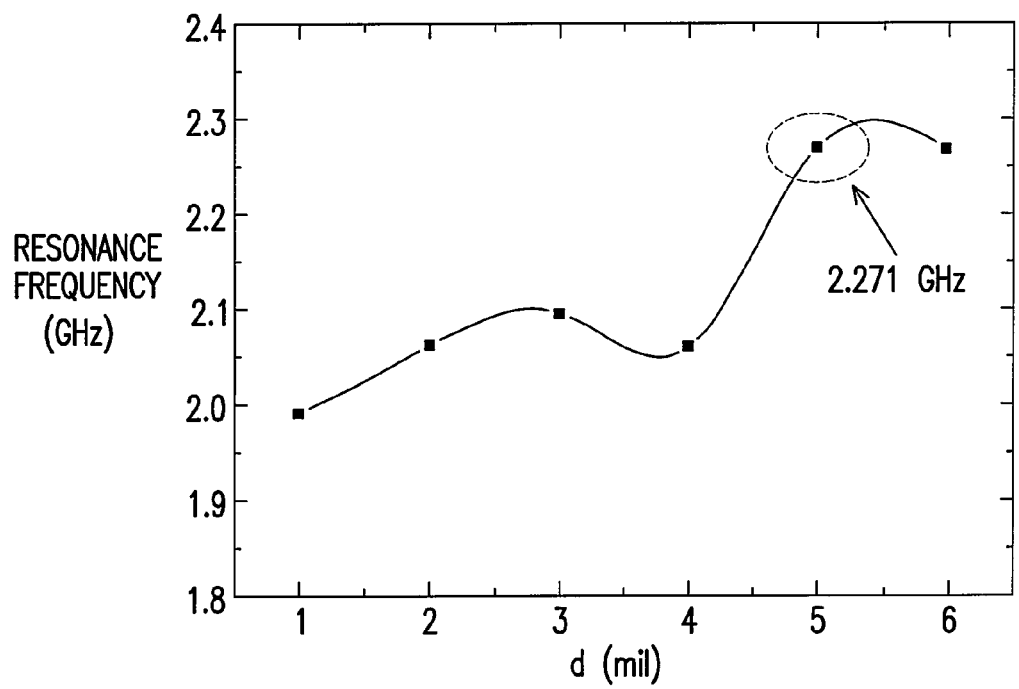
FIG. 4E is a characteristic simulation diagram of the resonance frequency-distance parameter d characteristic of the embedded multi-layers single-port co-plane capacitor according to the third embodiment of the present invention.

FIG. 4C is a characteristic simulation diagram of a conventional embedded multi-layers single-port plate capacitor, FIG. 4D is a characteristic simulation diagram of the capacitance vs distance parameter d of the embedded multi-layers single-port co-plane capacitor according to the third embodiment of the present invention and FIG. 4E is a characteristic simulation diagram of the resonance frequency vs distance parameter d of the embedded multi-layers single-port co-plane capacitor according to the third embodiment of the present invention. Referring to FIGS. 4C-4E, when the distance parameter d=4 mil, the capacitance of the capacitor structure of the third embodiment of the present invention is near to that of the conventional capacitor structure, but the capacitor structure of the third embodiment of the present invention has a higher resonance frequency than that of the conventional capacitor structure.

The relationships between the distance parameter d, the capacitance and the resonance frequency of the embodiment are listed in the following table. In order to compare with the prior art, the corresponding capacitance and resonance frequency of the conventional capacitor structure are included herein as well.

|  | d |  |  |  |  |  | conventional |
|---|---|---|---|---|---|---|---|
|  | 1 | 2 | 3 | 4 | 5 | 6 | capacitor |
| capacitance (pF) | 52.33 | 52.05 | 51.89 | 50.98 | 54.29 | 53.73 | 51.15 |
| resonance frequency (GHz) | 1.99 | 2.06 | 2.10 | 2.06 | 2.27 | 2.27 | 2.06 |

Figure 5:
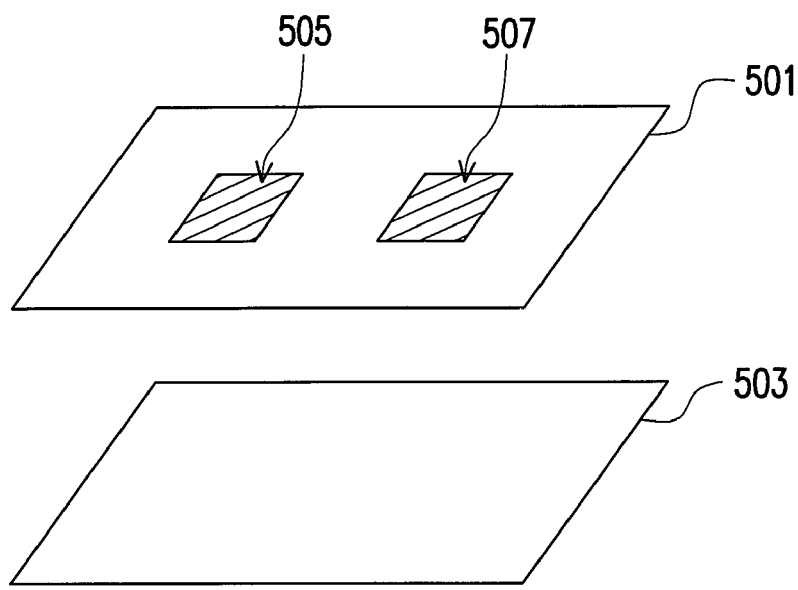
FIG. 5 is a perspective drawing of a single-port capacitor structure according to a fourth embodiment of the present invention.

FIG. 5 is a perspective drawing of a single-port capacitor structure according to a fourth embodiment of the present invention. The capacitor structure includes a signal electrode plate 501 and a ground electrode plate 503. Two openings 505 and 507 are disposed in the signal electrode plate 501. The ground electrode plate 503 is disposed under the signal electrode plate 501, so that the ground electrode plate 503 and the signal electrode plate 501 do not locate on the same plane.

Figure 6:
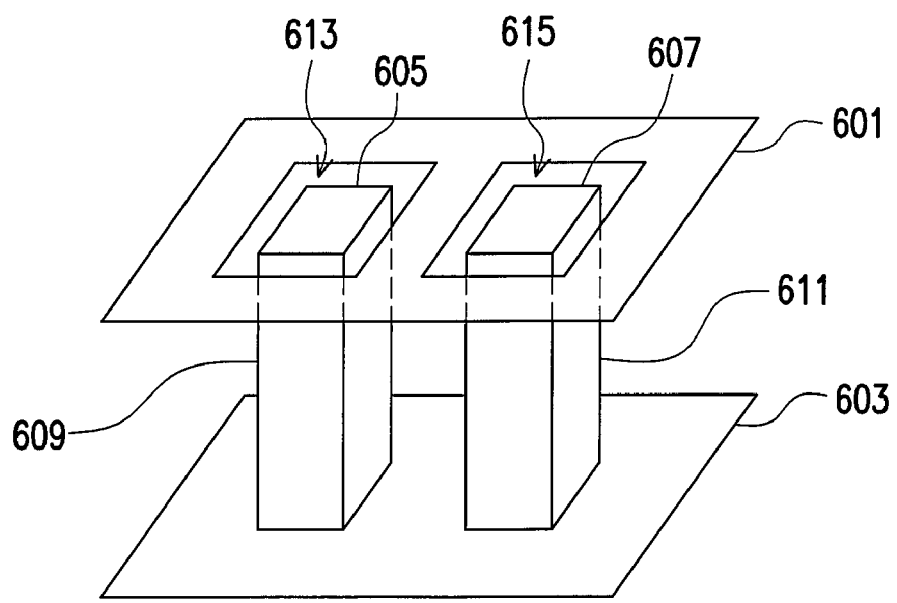
FIG. 6 is a perspective drawing of a single-port capacitor structure according to a fifth embodiment of the present invention.

FIG. 6 is a perspective drawing of a single-port capacitor structure according to a fifth embodiment of the present invention. The capacitor structure includes a signal electrode plate 601, two extension ground electrode plates 60D and 607, a ground electrode plate 603 and two interconnections 609 and 611. Two openings 613 and 615 are disposed in the signal electrode plate 601.

The extension ground electrode plates 605 and 607 are respectively disposed in the openings 613 and 615, and together with the signal electrode plate 601 locate on the same plane. The ground electrode plate 603 is disposed under the signal electrode plate 601, so that the ground electrode plate 603 and the signal electrode plate 601 do not locate on the same plane. The extension ground electrode plates 605 and 607 are electrically connected to the ground electrode plate 603 respectively through the interconnections 609 and 611.

Figure 7:
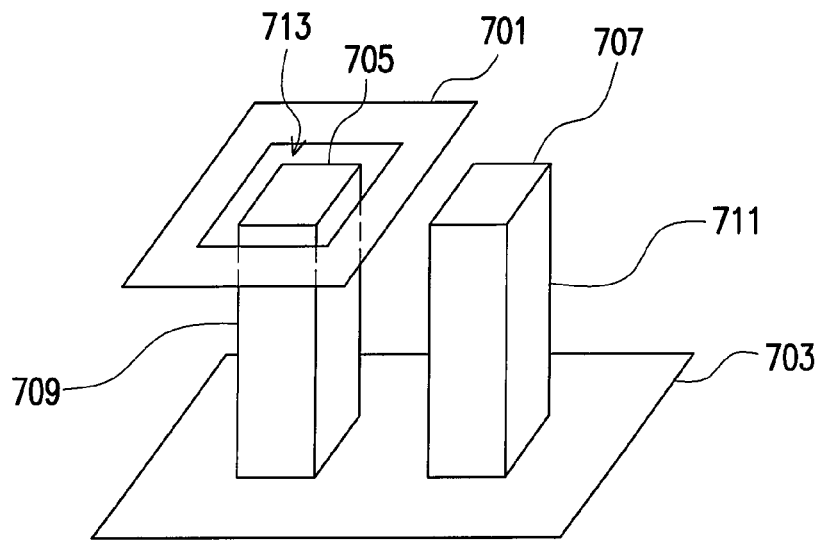
FIG. 7 is a perspective drawing of a single-port capacitor structure according to a sixth embodiment of the present invention.

FIG. 7 is a perspective drawing of a single-port capacitor structure according to a sixth embodiment of the present invention. The capacitor structure includes a signal electrode plate 701, two extension ground electrode plates 705 and 707, a ground electrode plate 703 and two interconnections 709 and 711. An opening 713 is disposed in the signal electrode plate 701.

The extension ground electrode plate 705 is disposed in the opening 713 and together with the signal electrode plate 701 locates on the same plane. The extension ground electrode plate 707 is disposed outside the signal electrode plate 701 and together with the signal electrode plate 701 locates on the same plane.

The ground electrode plate 703 is disposed under the signal electrode plate 701, so that the ground electrode plate 703 and the signal electrode plate 701 do not locate on the same plane. The extension ground electrode plates 705 and 707 are electrically connected to the ground electrode plate 703 respectively through the interconnections 709 and 711.

Figure 8:
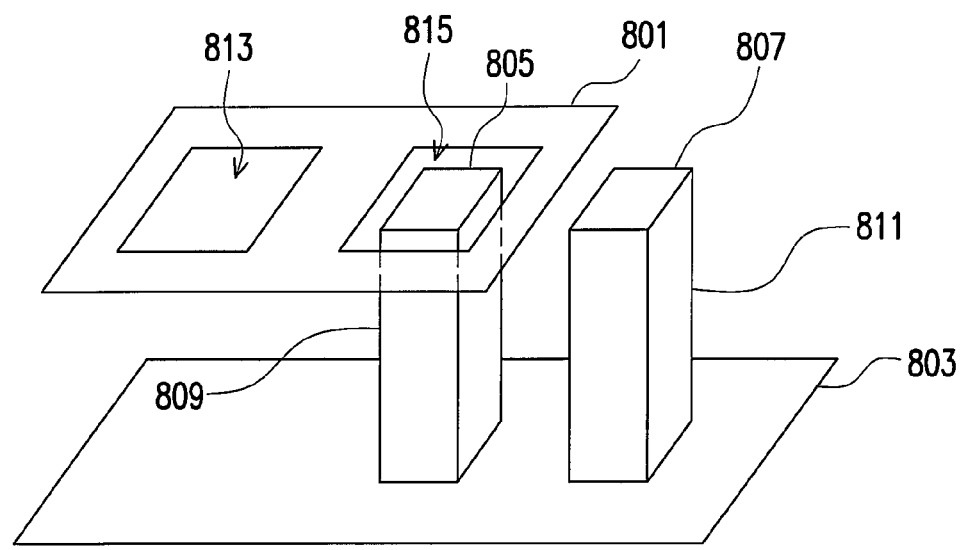
FIG. 8 is a perspective drawing of a single-port capacitor structure according to a seventh embodiment of the present invention.

FIG. 8 is a perspective drawing of a single-port capacitor structure according to a seventh embodiment of the present invention. The capacitor structure includes a signal electrode plate 801, two extension ground electrode plates 805 and 807, a ground electrode plate 803 and two interconnections 809 and 811. Two openings 813 and 815 are disposed in the signal electrode plate 801.

The extension ground electrode plate 705 is disposed in the opening 713 and together with the signal electrode plate 701 locates on the same plane. The extension ground electrode plate 707 is disposed outside the signal electrode plate 701 and together with the signal electrode plate 701 locates on the same plane.

Figure 8A:
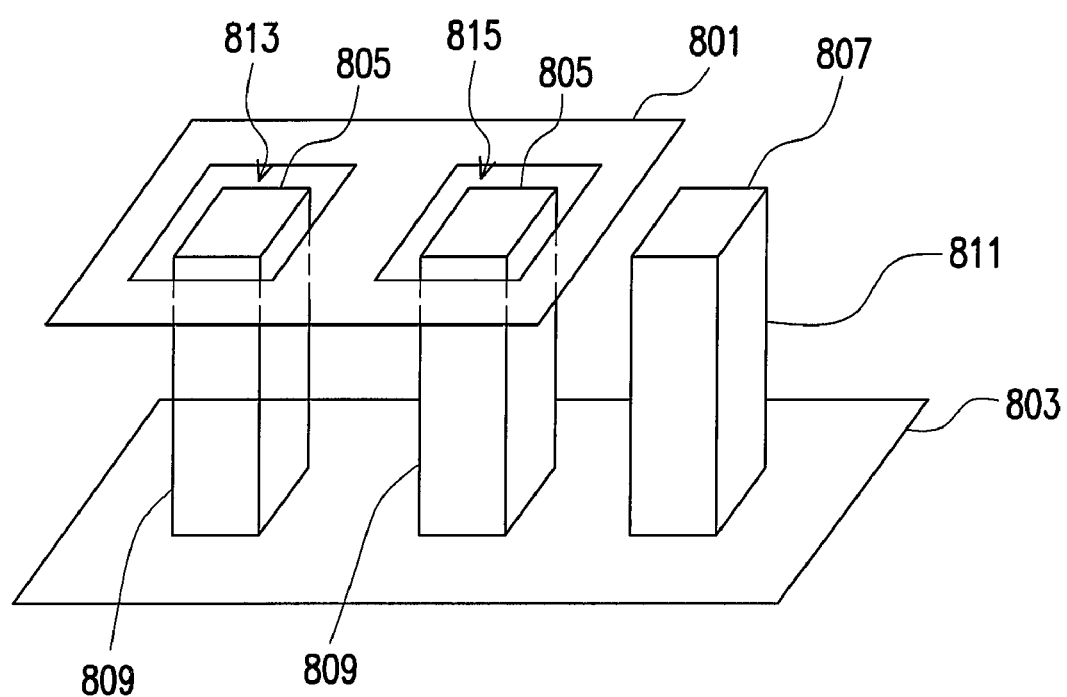
FIG. 8A is a perspective drawing of a modification of the capacitor in FIG. 8.

The ground electrode plate 803 is disposed under the signal electrode plate 801, so that the ground electrode plate 803 and the signal electrode plate 801 do not locate on the same plane. The extension ground electrode plates 805 and 807 are electrically connected to the ground electrode plate 803 respectively through the interconnections 809 and 811. FIG. 8A is a perspective drawing of a modification of the capacitor in FIG. 8, wherein both the extension ground electrode plates 805 and the interconnections 809 in the capacitor structure are multiple (at least two, respectively; in FIG. 8A only two each are shown, but anyone skilled in the art should know the quantities thereof are not limited to two).

Figure 9:
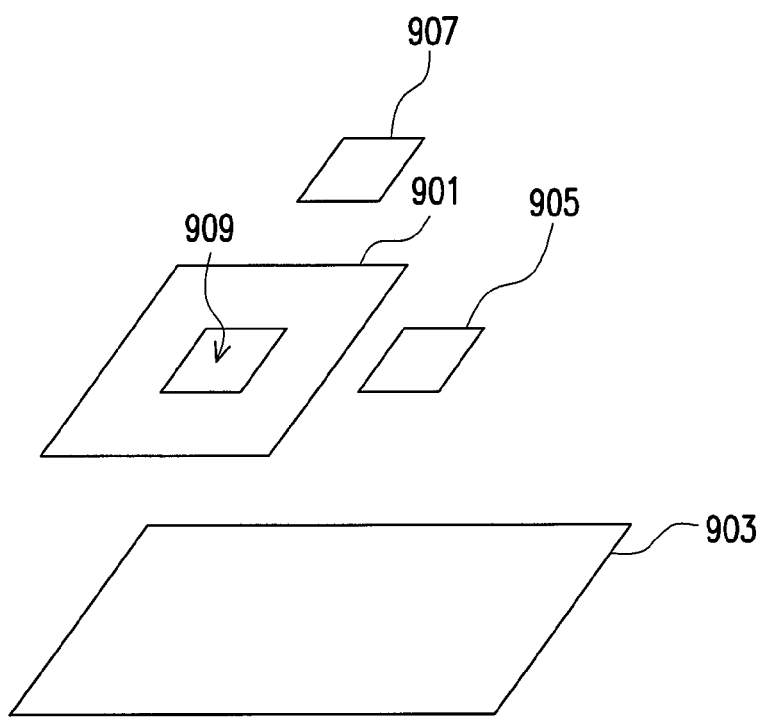
FIG. 9 is a perspective drawing of a single-port capacitor structure according to an eighth embodiment of the present invention.

FIG. 9 is a perspective drawing of a single-port capacitor structure according to an eighth embodiment of the present invention. The capacitor structure includes a signal electrode plate 901, two extension ground electrode plates 905 and 907 and a ground electrode plate 903, wherein the signal electrode plate 901 has an opening 909 disposed therein.

The extension ground electrode plates 905 and 907 are disposed outside the signal electrode plate 901 and together with the signal electrode plate 901 locate on the same plane. The ground electrode plate 903 is disposed under the signal electrode plate 901, so that the ground electrode plate 903 and the signal electrode plate 901 do not locate on the same plane.

Figure 10:
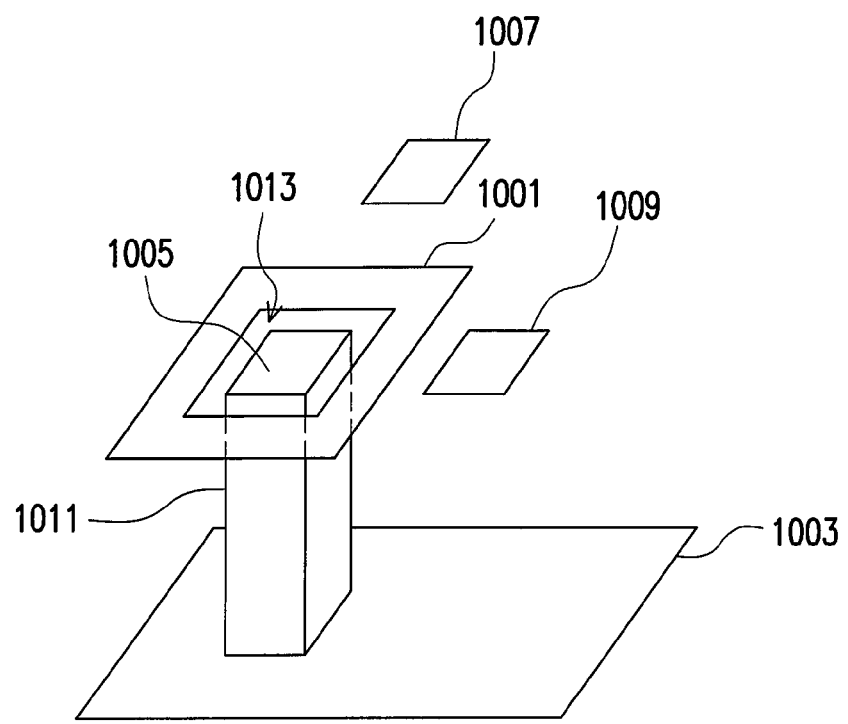
FIG. 10 is a perspective drawing of a single-port capacitor structure according to a ninth embodiment of the present invention.

FIG. 10 is a perspective drawing of a single-port capacitor structure according to a ninth embodiment of the present invention. The capacitor structure includes a signal electrode plate 1001, extension ground electrode plates 1005, 1007 and 1009, a ground electrode plate 1003 and an interconnection 1011, wherein the signal electrode plate 1001 has an opening 1013 disposed therein.

The extension ground electrode plate 1005 is disposed in the opening 1013 and together with the signal electrode plate 1001 locates on the same plane. The extension ground electrode plates 1007 and 1009 are disposed outside the signal electrode plate 1001 and together with the signal electrode plate 1001 locates on the same plane.

The ground electrode plate 1003 is disposed under the signal electrode plate 1001, so that the ground electrode plate 1003 and the signal electrode plate 1001 do not locate on the same plane. The extension ground electrode plates 1005 is electrically connected to the ground electrode plate 1003 through the interconnection 1011.

Figure 11:
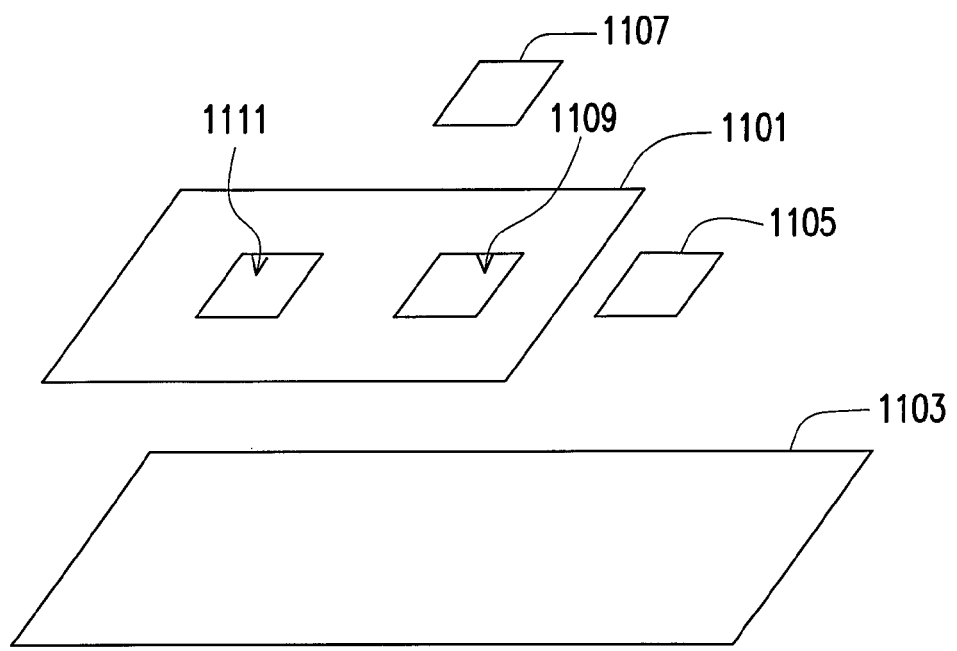
FIG. 11 is a perspective drawing of a single-port capacitor structure according to a tenth embodiment of the present invention.

FIG. 11 is a perspective drawing of a single-port capacitor structure according to a tenth embodiment of the present invention. The capacitor structure includes a signal electrode plate 1101, two extension ground electrode plates 1105 and 1107 and a ground electrode plate 1103, wherein the signal electrode plate 1101 has two openings 109 and 1111 disposed therein.

The extension ground electrode plates 1105 and 1107 are disposed outside the signal electrode plate 1101 and together with the signal electrode plate 1101 locates on the same plane. The ground electrode plate 1103 is disposed under the signal electrode plate 1101, so that the ground electrode plate 1103 and the signal electrode plate 1101 do not locate on the same plane.

Figure 12:
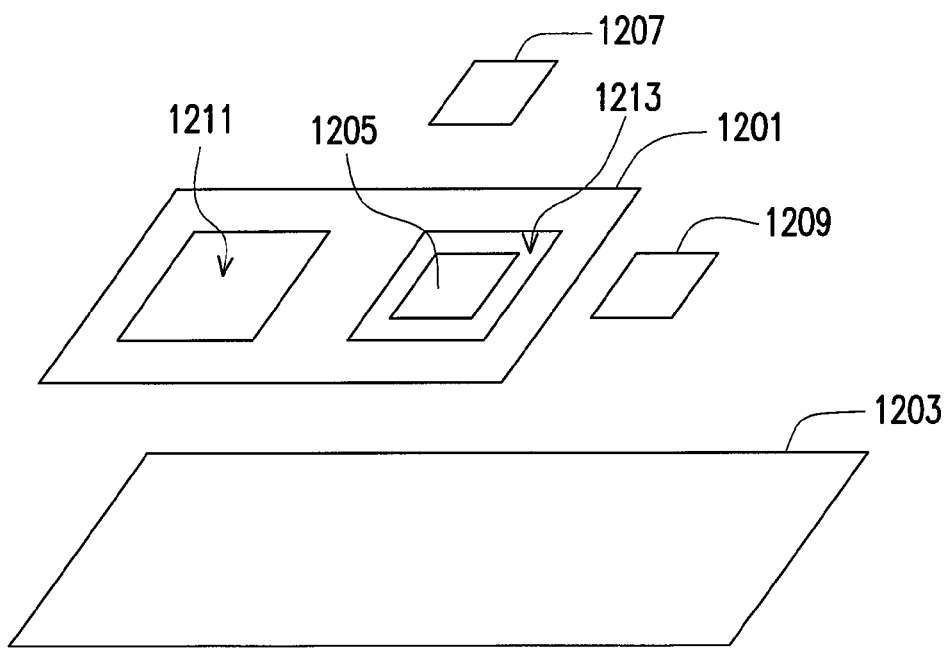
FIG. 12 is a perspective drawing of a single-port capacitor structure according to an eleventh embodiment of the present invention.

FIG. 12 is a perspective drawing of a single-port capacitor structure according to an eleventh embodiment of the present invention. The capacitor structure includes a signal electrode plate 1201, three extension ground electrode plates 1205, 1207 and 1209 and a ground electrode plate 1203, wherein the signal electrode plate 1201 has two openings 1211 and 1213 disposed therein.

The extension ground electrode plate 1205 is disposed in the opening 1211 or the opening 1213, and together with the signal electrode plate 1201 locates on the same plane. The extension ground electrode plates 1207 and 1209 are disposed outside the signal electrode plate 1201 and together with the signal electrode plate 1201 locates on the same plane. In addition, the ground electrode plate 1203 is disposed under the signal electrode plate 1201, so that the ground electrode plate 1203 and the signal electrode plate 1201 do not locate on the same plane.

Figure 13:
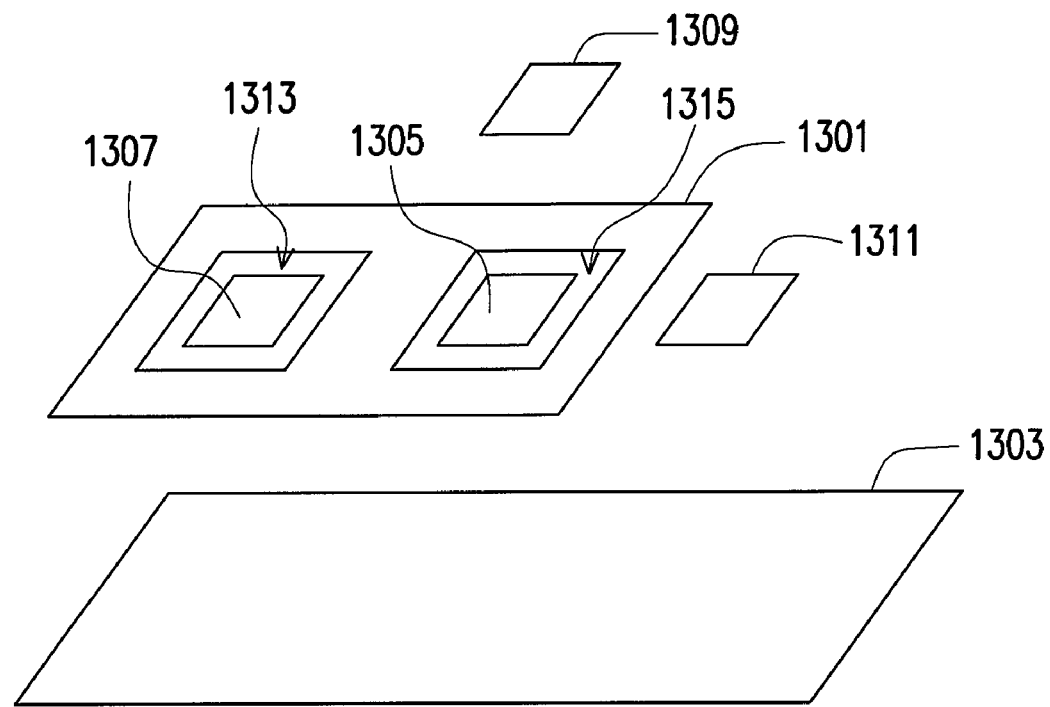
FIG. 13 is a perspective drawing of a single-port capacitor structure according to a twelfth embodiment of the present invention.

FIG. 13 is a perspective drawing of a single-port capacitor structure according to a twelfth embodiment of the present invention. The capacitor structure includes a signal electrode plate 1301, four extension ground electrode plates 1305, 1307, 1309 and 1311 and a ground electrode plate 1303, wherein the signal electrode plate 1301 has two openings 1313 and 1315 disposed therein.

The extension ground electrode plates 1305 and 1307 are respectively disposed in the openings 1313 and 1315, and they as well as the signal electrode plate 1301 locate on the same plane. The extension ground electrode plates 1309 and 1311 are disposed outside the signal electrode plate 1301 and they as well as the signal electrode plate 1301 locate on the same plane. In addition, the ground electrode plate 1303 is disposed under the signal electrode plate 1301, so that the ground electrode plate 1303 and the signal electrode plate 1301 do not locate on the same plane.

Figure 14:
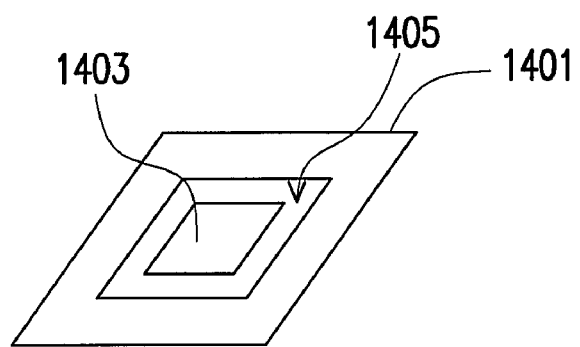
FIG. 14 is a schematic of a single-port capacitor structure according to a thirteenth embodiment of the present invention.

FIG. 14 is a schematic of a single-port capacitor structure according to a thirteenth embodiment of the present invention. The capacitor structure includes a signal electrode plate 1401 and an extension ground electrode plate 1403, wherein the signal electrode plate 1401 has an opening 1405 disposed therein. The extension ground electrode plate 1403 is disposed in the opening 1405 and it as well as the signal electrode plate 1401 locate on the same plane. Note that the signal electrode plate 1401 and the extension ground electrode plate 1403 together locate on the same plane to form a co-plane capacitor structure, wherein one of the signal electrode plate 1401 and the extension ground electrode plate 1403 is virtually grounded, for example, the extension ground electrode plate 1403 is virtually grounded. In addition, the above-mentioned description is applicable to other embodiments of the present invention, that is, the extension ground electrode plate in other embodiments is allowed to be virtually grounded.

Figure 15:
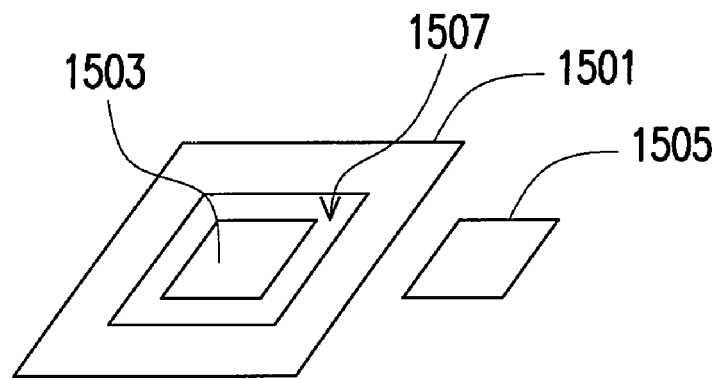
FIG. 15 is a schematic of a single-port capacitor structure according to a fourteenth embodiment of the present invention.

FIG. 15 is a schematic of a single-port capacitor structure according to a fourteenth embodiment of the present invention. The capacitor structure includes a signal electrode plate 1501 and two extension ground electrode plates 1503 and 1505, wherein the signal electrode plate 1501 has an opening 1507 disposed therein. The extension ground electrode plate 1505 is disposed in the opening 1507 and it as well as the signal electrode plate 1501 locate on the same plane. The extension ground electrode plate 1505 is disposed outside the signal electrode plate 1501, and it as well as the signal electrode plate 1501 locate on the same plane.

Figure 16:
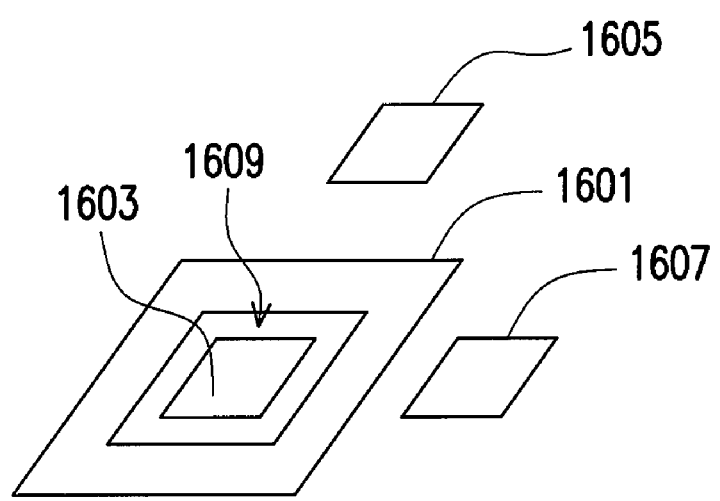
FIG. 16 is a schematic of a single-port capacitor structure according to a fifteenth embodiment of the present invention.

FIG. 16 is a schematic of a single-port capacitor structure according to a fifteenth embodiment of the present invention. The capacitor structure includes a signal electrode plate 1601 and three extension ground electrode plates 1603, 1605 and 1607. An opening 1609 is disposed in the signal electrode plate 1601.

The extension ground electrode plate 1603 is disposed in the opening 1609 and it as well as the signal electrode plate 1601 locate on the same plane. The extension ground electrode plates 1605 and 1607 are disposed outside the signal electrode plate 1601 and they as well as the signal electrode plate 1601 locate on the same plane.

Figure 17:
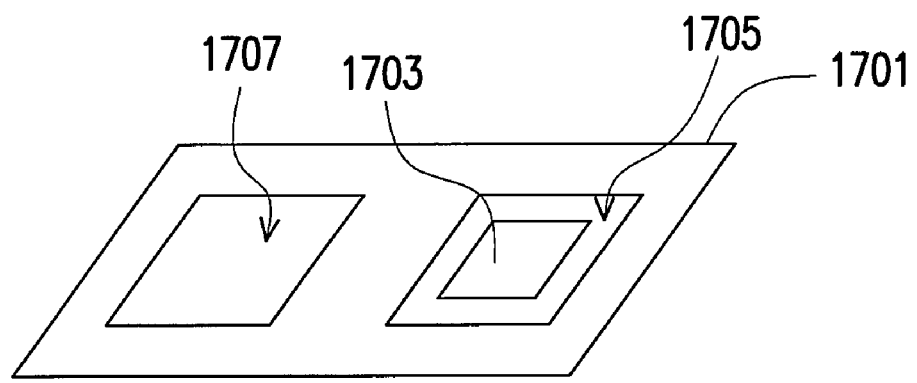
FIG. 17 is a schematic of a single-port capacitor structure according to a sixteenth embodiment of the present invention.

FIG. 17 is a schematic of a single-port capacitor structure according to a sixteenth embodiment of the present invention. The capacitor structure includes a signal electrode plate 1701 and an extension ground electrode plate 1703. Two openings 1705 and 1707 are disposed in the signal electrode plate 1701. The extension ground electrode plate 1703 may be disposed in the opening 1705 or in the opening 1707, and it as well as the signal electrode plate 1701 locate on the same plane.

Figure 18:
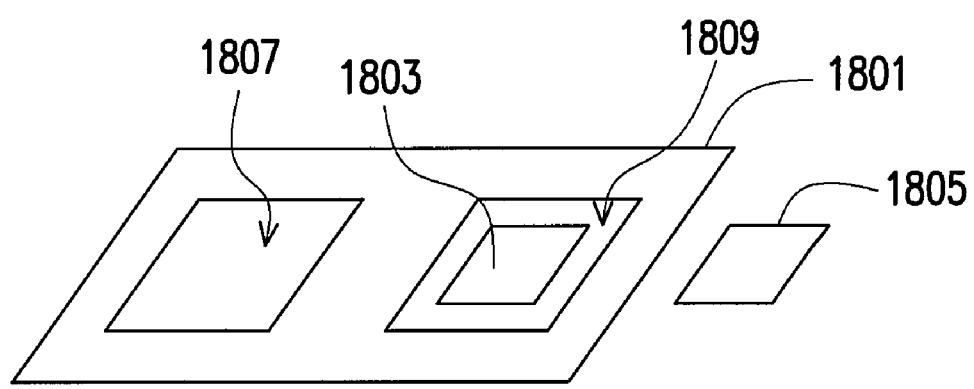
FIG. 18 is a schematic of a single-port capacitor structure according to a seventeenth embodiment of the present invention.

FIG. 18 is a schematic of a single-port capacitor structure according to a seventeenth embodiment of the present invention. The capacitor structure includes a signal electrode plate 1801 and two extension ground electrode plates 1803 and 1805, wherein the signal electrode plate 1801 has two openings 1807 and 1809 disposed therein.

The extension ground electrode plate 1803 may be disposed in the opening 1807 or in the opening 1809 and it as well as with the signal electrode plate 1801 locate on the same plane. The extension ground electrode plate 1805 is disposed outside the signal electrode plate 1801 and it as well as the signal electrode plate 1801 locate on the same plane.

Figure 19:
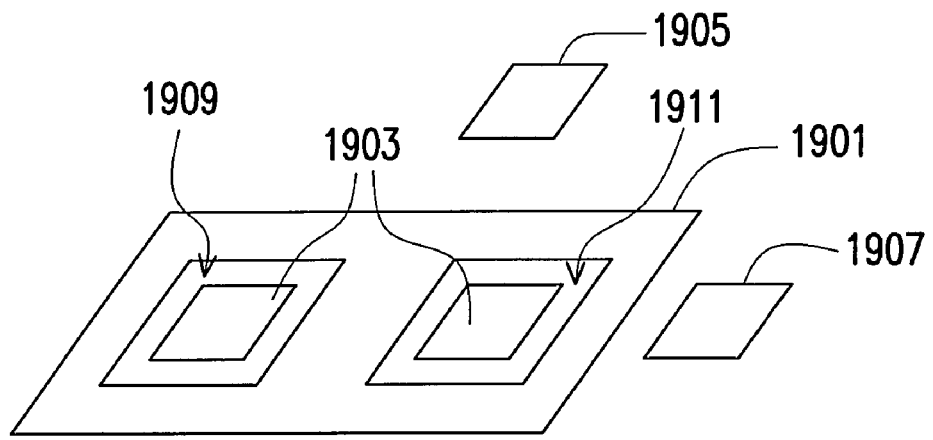
FIG. 19 is a schematic of a single-port capacitor structure according to an eighteenth embodiment of the present invention.

FIG. 19 is a schematic of a single-port capacitor structure according to an eighteenth embodiment of the present invention. The capacitor structure includes a signal electrode plate 1901 and three extension ground electrode plates 1903 and 1905 and 1907, wherein the signal electrode plate 1901 has two openings 1909 and 1911 disposed therein.

The extension ground electrode plate 1903 may be disposed in the opening 1909 or in the opening 1911, and it together with the signal electrode plate 1901 locate on the same plane. The extension ground electrode plates 1905 and 1907 are disposed outside the signal electrode plate 1901 and they together with the signal electrode plate 1901 locate on the same plane.

Figure 20:
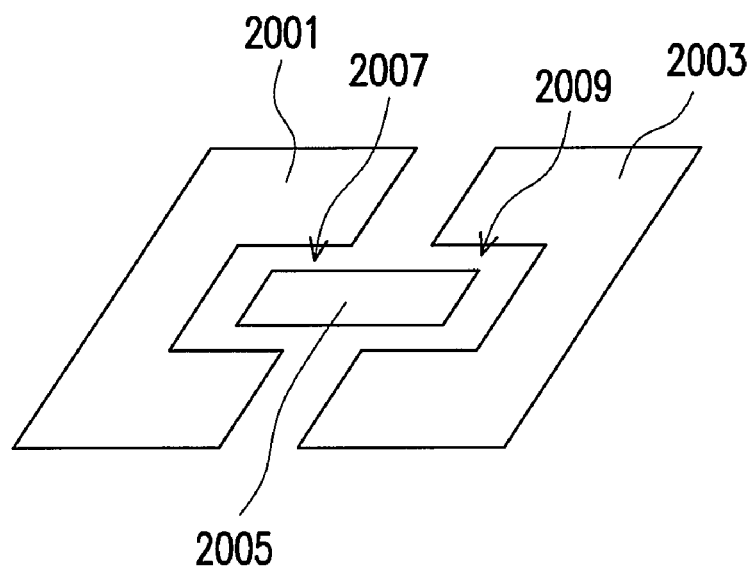
FIG. 20 is a schematic of a dual-port capacitor structure according to a nineteenth embodiment of the present invention.

FIG. 20 is a schematic of a dual-port capacitor structure according to a nineteenth embodiment of the present invention. The capacitor structure includes two signal electrode plates 2001 and 2003 and an extension ground electrode plate 2005, wherein the signal electrode plates 2001 and 2003 respectively have an openings 2007 and an opening 2009 disposed therein. The shape synthesized by the openings 2007 and 2009 is not limited to the rectangle as shown in FIG. 20, but any shapes, for example, circle or polygon and the like. Note that if the above-mentioned implementation way is applicable to the embodiments hereinafter, the related depictions are omitted in the following embodiments.

The signal electrode plate 2001, the signal electrode plate 2003 and the extension ground electrode plate 2005 together locate on the same plane, and the extension around electrode plate 2005 is disposed in the openings 2007 and 2009. The signal electrode plates 2001 and 2003 and the extension ground electrode plate 2005 together form a dual-port co-plane capacitor structure.

Figure 21A:
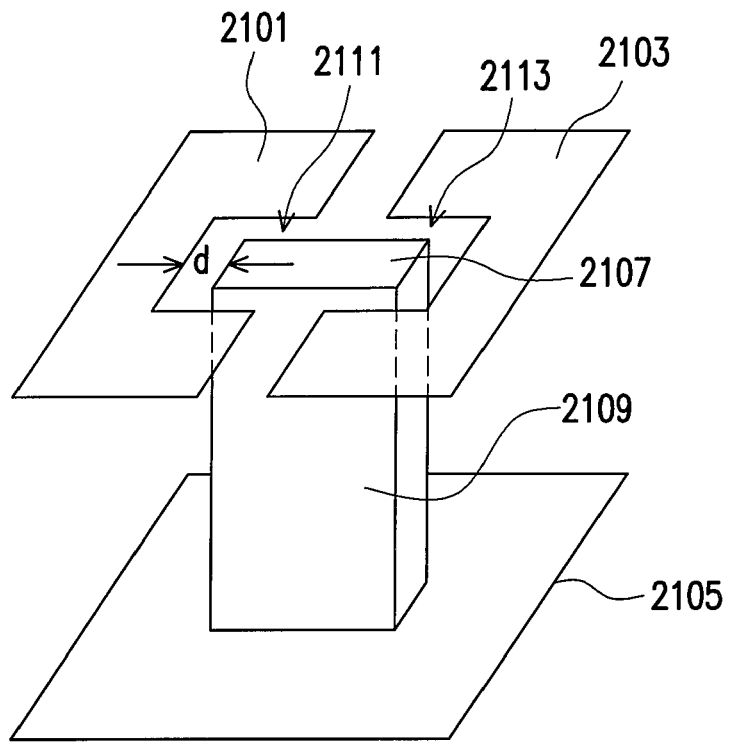
FIG. 21A is a perspective drawing of a dual-port capacitor structure according to a twentieth embodiment of the present invention.

FIG. 21A is a perspective drawing of a dual-port capacitor structure according to a twentieth embodiment of the present invention. The capacitor structure includes two signal electrode plates 2101 and 2103, a extension ground electrode plate 2107, a ground electrode plate 2105 and an interconnection 2109, wherein the signal electrode plates 2101 and 2103 respectively have an opening 2111 and an opening 2113 disposed therein.

The signal electrode plate 2101, the signal electrode plate 2103 and the extension ground electrode plate 2107 locate on the same plane. In order to easily simulate the electrical characteristic, in the embodiment, the extension ground electrode plate 2107 is disposed at the center of the openings 2111 and 2113. However, the extension ground electrode plate 2107 is not necessarily disposed at the center of the openings 2111 and 2113. In addition, the edge of the extension ground electrode plate 2107 is respectively from the edge of the opening 2111 and the opening 2113 by a distance parameter d, wherein the distance parameter d is in unit of mil (0.001 inch).

The ground electrode plate 2105 is disposed under the signal electrode plate 2101, so that the ground electrode plate 2105 and the signal electrode plate 2101 do not locate on the same plane. The extension ground electrode plate 2107 is electrically connected to the ground electrode plate 2105 through the interconnection 2109.

Note that since the signal electrode plate 2101, the signal electrode plate 2103 and the extension ground electrode plate 2107 locate on the same plane, thus they together form a co-plane capacitor structure, which contributes to increase the resonance frequency and reduce the effect of the parasitic effect.

Figure 21B:
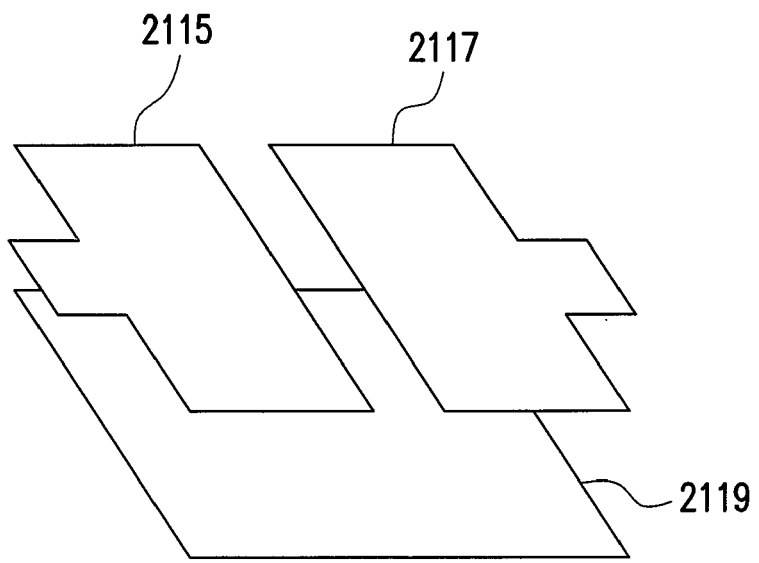
FIG. 21B is a perspective drawing of a conventional dual-port capacitor structure.

FIG. 21B is a perspective drawing of a conventional dual-port capacitor structure. The capacitor includes signal electrode plates 2115 and 2117 and a ground electrode plate 2119. The signal electrode plate 2115 and the signal electrode plate 2117 locate on the same plane, while the signal electrode plate 2115 is disposed over the ground electrode plate 2119. Referring to FIGS. 21A and 21B, it is clear the signal electrode plates 2115 and 2117 in FIG. 21B have no openings, therefore, the conventional capacitor structure is not counted as a co-plane capacitor structure.

Figure 21C:
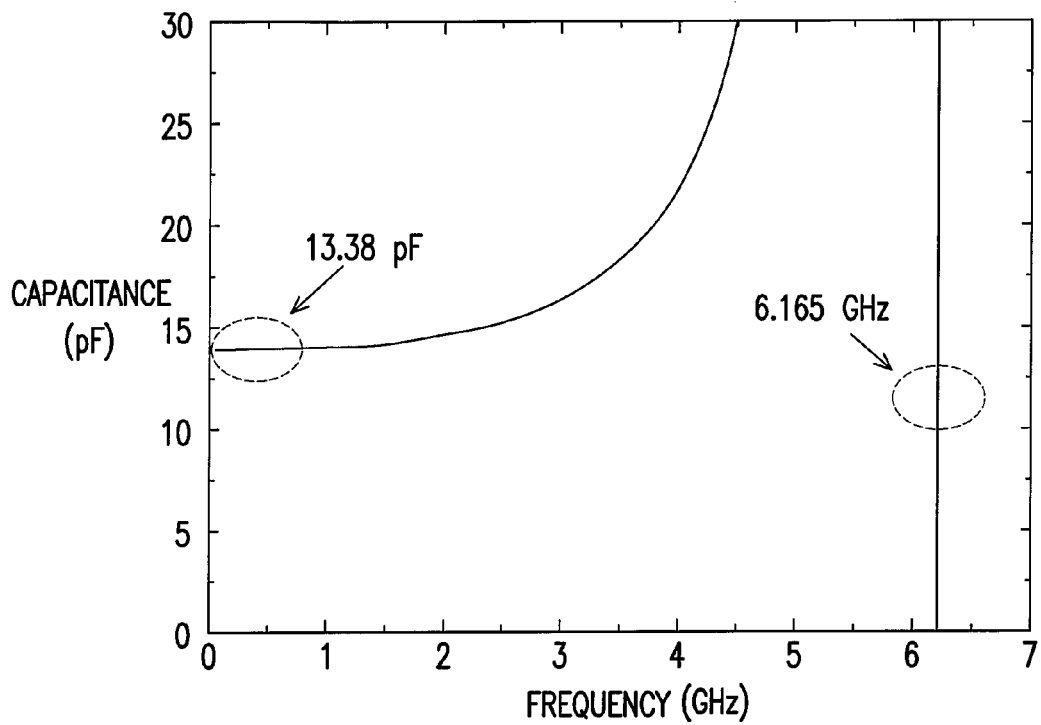
FIG. 21C is a characteristic simulation diagram of the capacitance-frequency of the conventional dual-port capacitor in FIG. 21B.
Figure 21D:
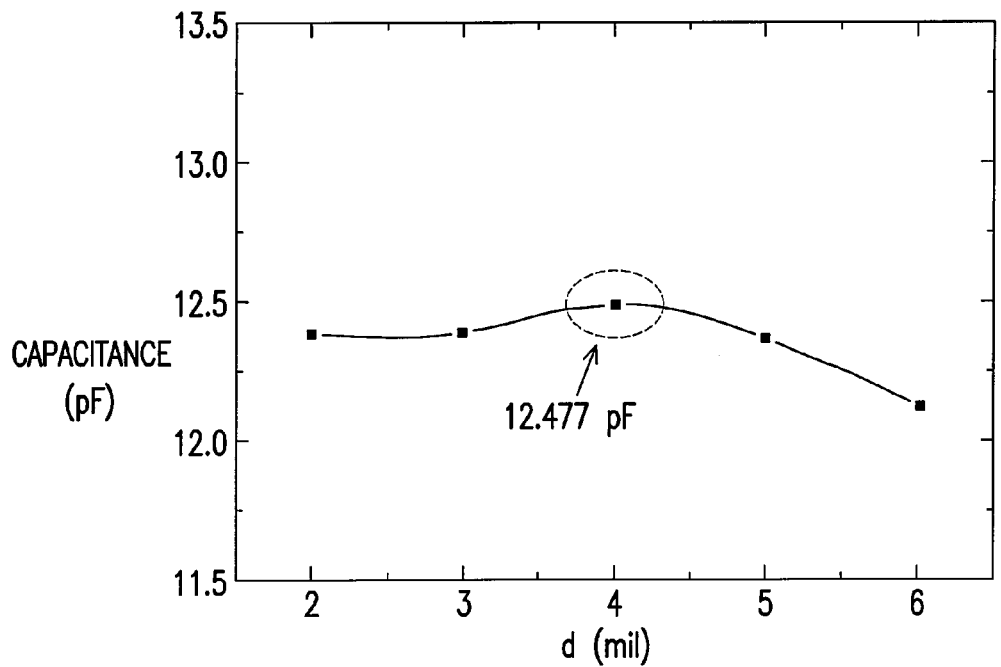
FIG. 21D is a characteristic simulation diagram of the distance parameter vs. capacitance of the dual-port co-plane capacitor according to the twentieth embodiment of the present invention.
Figure 21E:
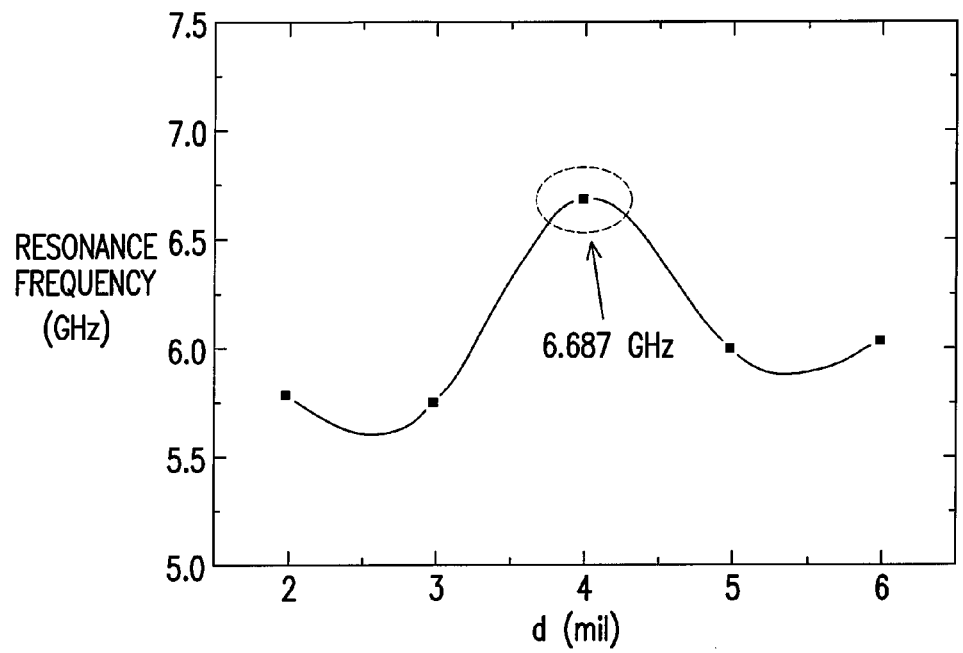
FIG. 21E is a characteristic simulation result of the resonance frequency vs distance parameter of the dual-port capacitor according to the twentieth embodiment of the present invention.

FIG. 21C is a characteristic simulation diagram of the conventional dual-port plate capacitor in FIG. 21C, FIG. 21D is a characteristic simulation diagram of the capacitance vs distance parameter d of a dual-port co-plane capacitor according to the twentieth embodiment of the present invention and FIG. 21E is a characteristic simulation diagram of the resonance frequency vs distance parameter d of the dual-port co-plane capacitor according to the twentieth embodiment of the present invention. Referring to FIGS. 21C-21E, when the distance parameter d=4 mil, the capacitance of the capacitor structure according to the twentieth embodiment of the present invention is near to that of the conventional capacitor structure, but the capacitor structure according to the twentieth embodiment of the present invention has a higher resonance frequency than that of the conventional capacitor structure.

The relationships between the distance parameter d, the capacitance and the resonance frequency of the embodiment are listed in the following table. In order to compare with the prior art, the corresponding capacitance and resonance frequency of the conventional capacitor structure are included herein as well.

|  | d | | | | | conventional capacitor |
| --- | --- | --- | --- | --- | --- | --- |
|  | 2 | 3 | 4 | 5 | 6 |  |
| capacitance (pF) | 12.37 | 12.38 | 12.48 | 12.36 | 12.11 | 13.38 |
| resonance frequency (GHz) | 5.78 | 5.75 | 6.69 | 5.99 | 6.03 | 6.17 |

It can be seen from the above-mentioned table that when the distance parameter d=4 mil, the resonance frequency of the co-plane capacitor structure according to the twentieth embodiment of the present invention gets significantly raised, meanwhile the capacitance remains almost not changed.

Figure 22:
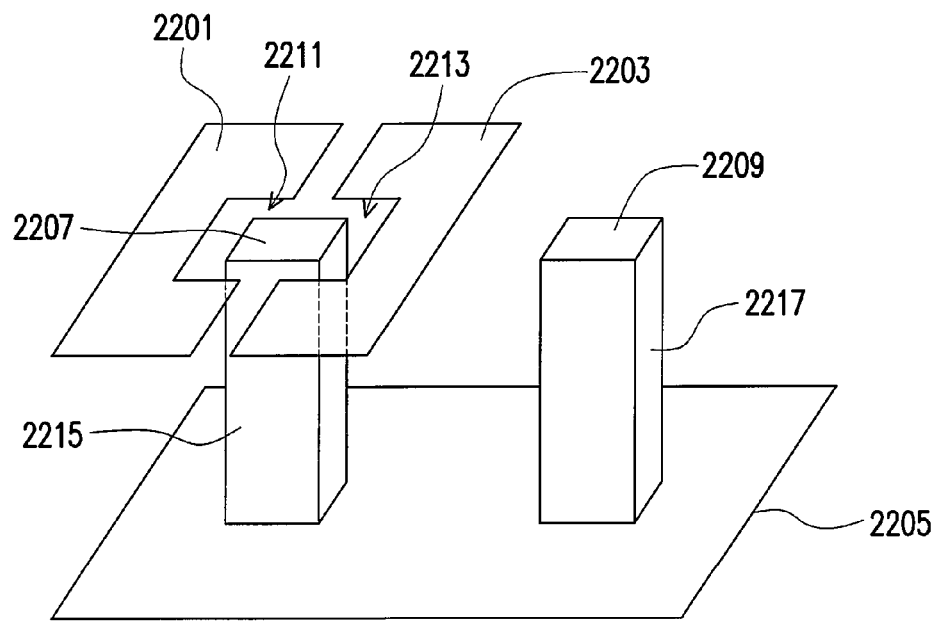
FIG. 22 is a perspective drawing of a dual-port capacitor structure according to a twenty-first embodiment of the present invention.

FIG. 22 is a perspective drawing of a dual-port capacitor structure according to a twenty-first embodiment of the present invention. The capacitor structure includes two signal electrode plates 2201 and 2203, two extension ground electrode plates 2207 and 2209, a ground electrode plate 2205 and two interconnections 2215 and 2217, wherein the signal electrode plates 2201 and 2203 respectively have an opening 2211 and an opening 2213 disposed therein.

The signal electrode plate 2201, the signal electrode plate 2203, the extension ground electrode plate 2207 and the extension ground electrode plate 2209 together locate on the same plane. The extension ground electrode plate 2207 is disposed in the openings 2211 and 2213. In addition, the extension ground electrode plate 2209 is disposed outside the signal electrode plates 2201 and 2203.

The ground electrode plate 2205 is disposed under the signal electrode plate 2201, so that the ground electrode plate 2205 and the signal electrode plate 2201 do not locate on the same plane. The extension ground electrode plate 2207 and the extension ground electrode plate 2209 are electrically connected to the ground electrode plate 2205 respectively through the interconnections 2215 and 2217.

Figure 23:
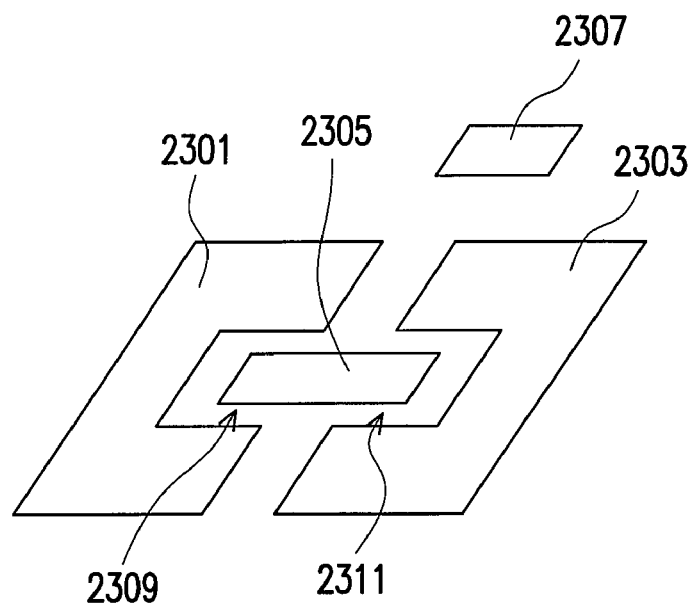
FIG. 23 is a schematic of a dual-port capacitor structure according to a twenty-second embodiment of the present invention.

FIG. 23 is a schematic of a dual-port capacitor structure according to a twenty-second embodiment of the present invention. The capacitor structure includes two signal electrode plates 2301 and 2303 and two extension ground electrode plates 2305 and 2307, wherein the signal electrode plates 2301 and 2303 respectively have an opening 2309 and an opening 2311 disposed therein.

The signal electrode plate 2301, the signal electrode plate 2303, the extension ground electrode plate 2305 and the extension ground electrode plate 2307 together locate on the same plane. The extension ground electrode plate 2305 is disposed in the openings 2309 and 2311, while the extension ground electrode plate 2307 is disposed outside the signal electrode plates 2301 and 2303.

Figure 24:
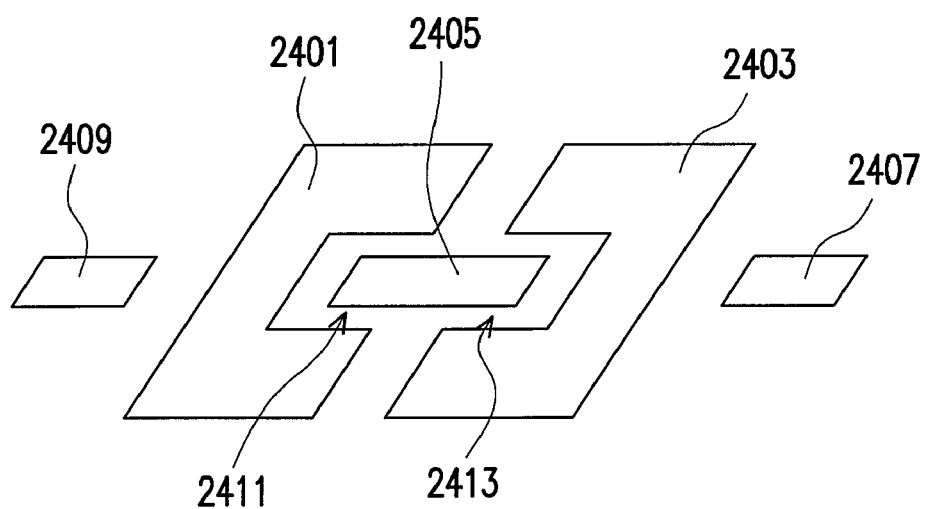
FIG. 24 is a schematic of a dual-port capacitor structure according to a twenty-third embodiment of the present invention.

FIG. 24 is a schematic of a dual-port capacitor structure according to a twenty-third embodiment of the present invention. The capacitor structure includes two signal electrode plates 2401 and 2403 and three extension ground electrode plates 2405, 2407 and 2409, wherein the signal electrode plates 2401 and 2403 respectively have an opening 2411 and an opening 2413 disposed therein.

The signal electrode plate 2401, the signal electrode plate 2403, the extension ground electrode plate 2405, the extension ground electrode plate 2407 and the extension ground electrode plate 2409 together locate on the same plane. The extension ground electrode plate 2405 is disposed in the openings 2411 and 2413, while the extension ground electrode plates 2407 and 2409 are disposed outside the signal electrode plates 2401 and 2403.

Figure 25:
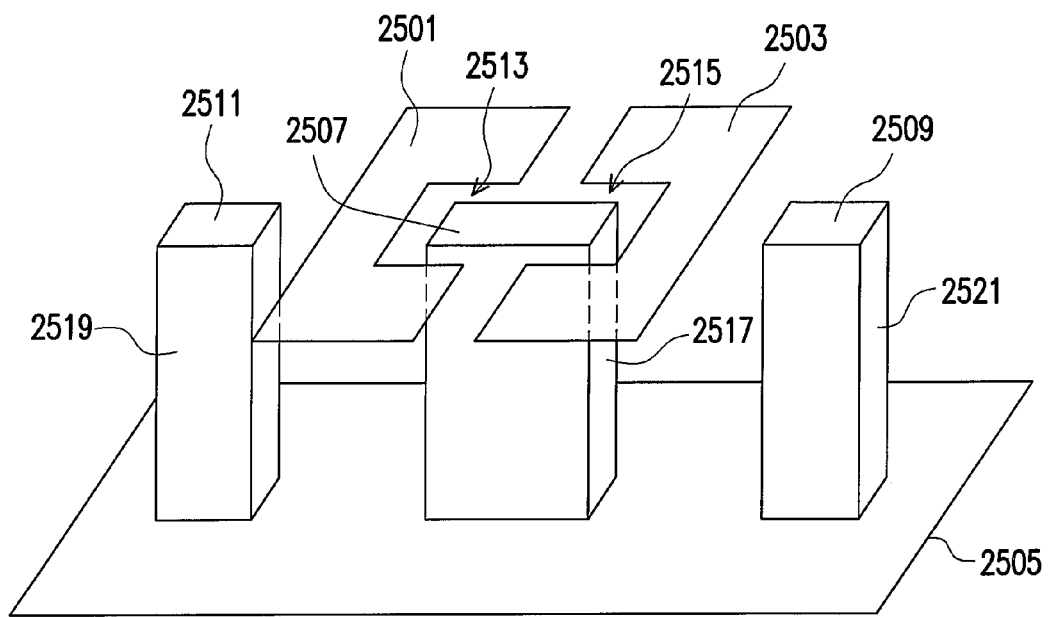
FIG. 25 is a perspective drawing of a dual-port capacitor structure according to a twenty-fourth embodiment of the present invention.

FIG. 25 is a perspective drawing of a dual-port capacitor structure according to a twenty-fourth embodiment of the present invention. The capacitor structure includes two signal electrode plates 2501 and 2503, three extension ground electrode plates 2507, 2509 and 2511, a ground electrode plate 2505 and three interconnections 2517, 2519 and 2521, wherein the signal electrode plates 2501 and 2503 respectively have an opening 2513 and an opening 2515 disposed therein.

The signal electrode plate 2501, the signal electrode plate 2503, the extension ground electrode plate 2507, the extension ground electrode plate 2509 and the extension ground electrode plate 2511 together locate on the same plane. The extension ground electrode plate 2507 is disposed in the openings 2513 and 2515, while the extension ground electrode plates 2509 and 2511 are disposed outside the signal electrode plates 2501 and 2503.

The ground electrode plate 2505 is disposed under the signal electrode plate 2501, so that the ground electrode plate 2505 and the signal electrode plate 2501 do not locate on the same plane. The extension ground electrode plates 2507, 2509 and 2511 are electrically connected to the ground electrode plate 2505 respectively through the interconnections 2517, 2521 and 2519.

Figure 26:
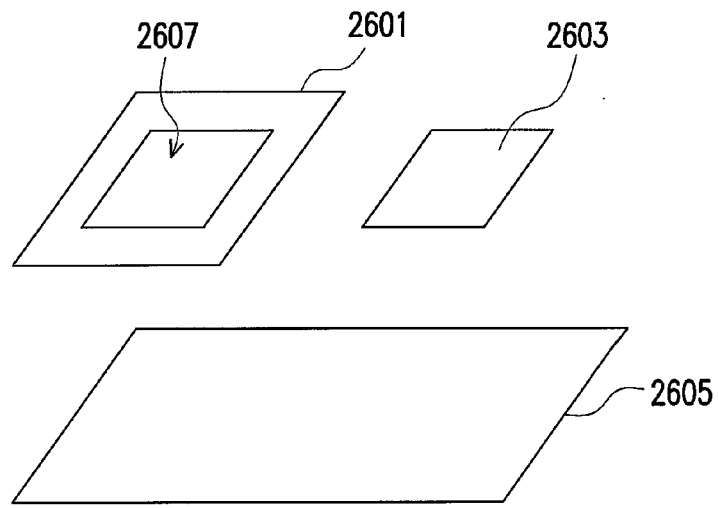
FIG. 26 is a perspective drawing of a dual-port capacitor structure according to a twenty-fifth embodiment of the present invention.

FIG. 26 is a perspective drawing of a dual-port capacitor structure according to a twenty-fifth embodiment of the present invention. The capacitor structure includes two signal electrode plates 2601 and 2603 and a ground electrode plate 2605, wherein one of the signal electrode plate 2601 or the signal electrode plate 2603 has an opening 2607 disposed therein.

The signal electrode plate 2601 and the signal electrode plate 2603 locate on the same plane, while the ground electrode plate 2605 is disposed under the signal electrode plate 2601, so that the ground electrode plate 2605 and the signal electrode plate 2601 do not locate on the same plane.

Figure 27:
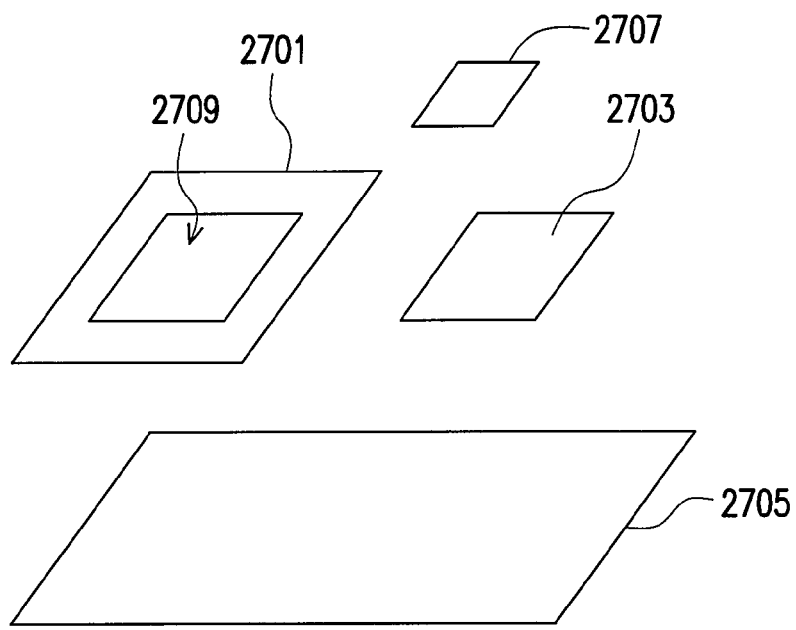
FIG. 27 is a perspective drawing of a dual-port capacitor structure according to a twenty-sixth embodiment of the present invention.

FIG. 27 is a perspective drawing of a dual-port capacitor structure according to a twenty-sixth embodiment of the present invention. The capacitor structure includes two signal electrode plates 2701 and 2703, an extension ground electrode plate 2707 and a ground electrode plate 2705, wherein one of the signal electrode plate 2701 and the signal electrode plate 2703 has an opening 2709 disposed therein.

The signal electrode plate 2701, the signal electrode plate 2703 and the extension ground electrode plate 2707 locate on the same plane. The extension ground electrode plate 2707 is disposed outside the signal electrode plates 2701 and 2703, while the ground electrode plate 2705 is disposed under the signal electrode plate 2701, so that the ground electrode plate 2705 and the signal electrode plate 2701 do not locate on the same plane.

Figure 28A:
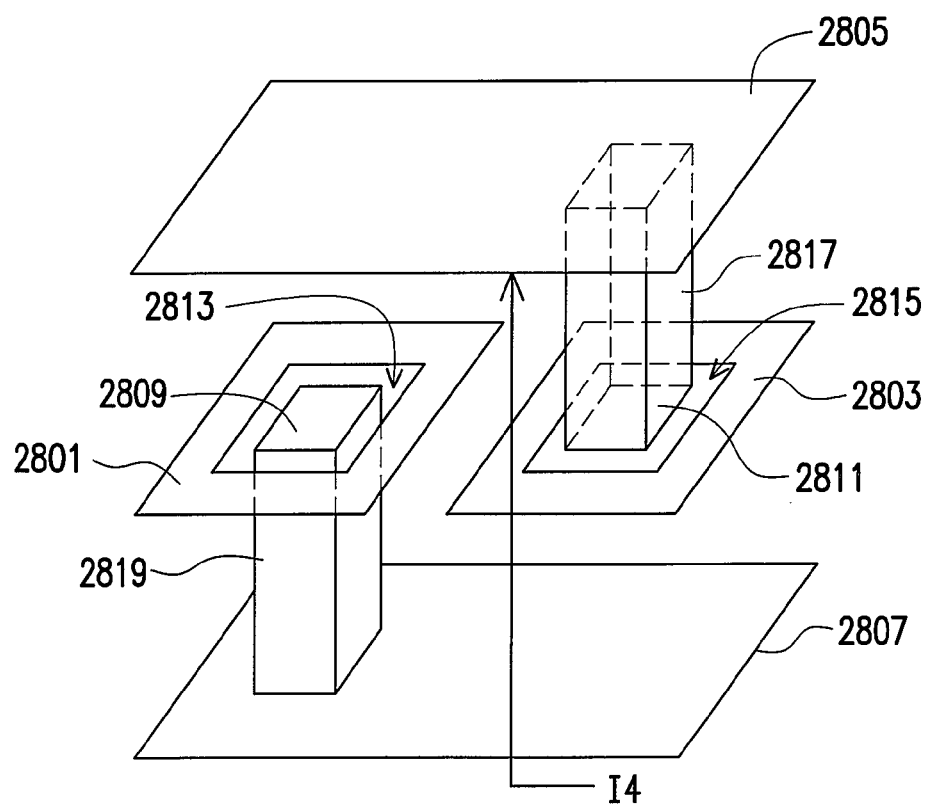
FIG. 28A is a perspective drawing of an embedded multi-layers dual-port capacitor structure according to a twenty-seventh embodiment of the present invention.

FIG. 28A is a perspective drawing of an embedded multi-layers dual-port capacitor structure according to a twenty-seventh embodiment of the present invention. The capacitor structure includes two signal electrode plates 2801 and 2803, two extension ground electrode plates 2809 and 2811, two ground electrode plates and two interconnections 2817 and 1819, wherein the signal electrode plates 2801 and 2803 respectively have an opening 2813 and an opening 2815 disposed therein.

The signal electrode plate 2801, the signal electrode plate 2803, the extension ground electrode plate 2809 and the extension ground electrode plate 2811 together locate on the same plane. The ground electrode plates 2805 and 2807 are respectively disposed over and under the signal electrode plate 2801, the extension ground electrode plate 2809 is electrically connected to the ground electrode plate 2807 through the interconnection 2819 and the ground electrode plate 2811 is electrically connected to the ground electrode plate 2805 through the interconnection 2817.

In the embodiment, the co-plane capacitor structure formed by the signal electrode plates 2801 and 2803 and the extension ground electrode plates 2809 and 2811 is embedded in the capacitor device.

Figure 28B:
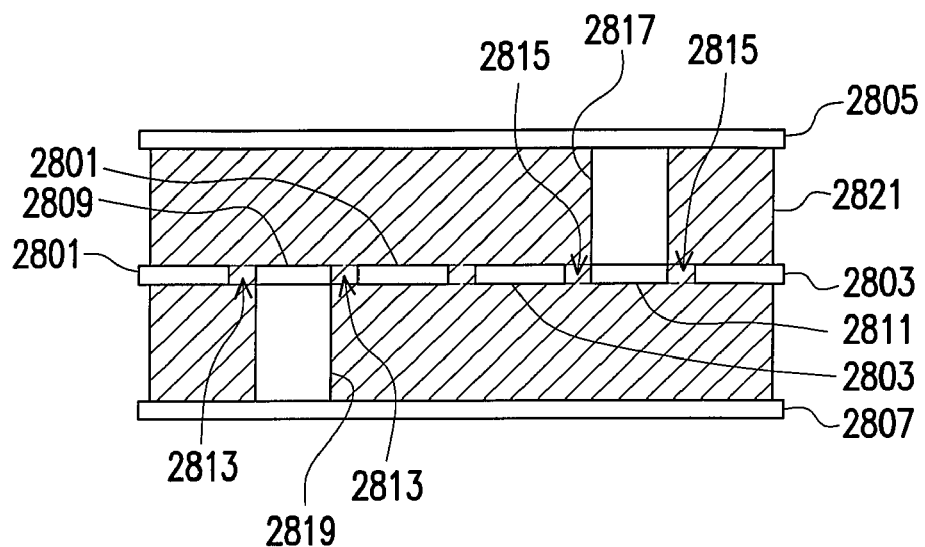
FIG. 28B is a schematic cross section drawing of the embedded multi-layers dual-port capacitor structure in FIG. 28A according to the twenty-seventh embodiment of the present invention.

FIG. 28B is a schematic cross section drawing of the embedded multi-layers dual-port capacitor structure along line 14 in FIG. 28A according to the twenty-seventh embodiment of the present invention. Referring to FIG. 28B, a dielectric layer 2821 is disposed between the ground electrode plate 2805 and the signal electrode plate 2803 and between the signal electrode plate 2803 and the ground electrode plate 2807.

Figure 29A:
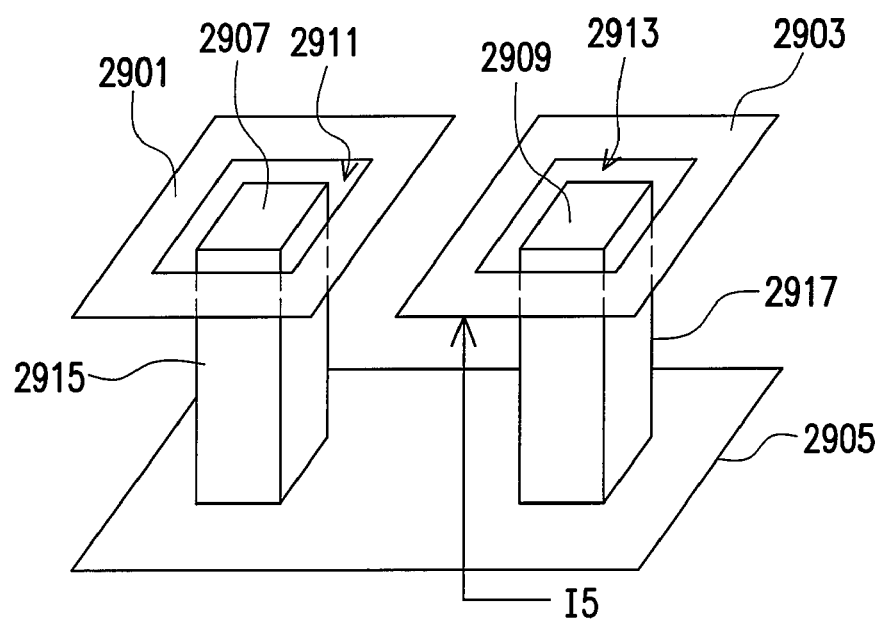
FIG. 29A is a perspective drawing of a dual-port capacitor structure according to a twenty-eighth embodiment of the present invention.

FIG. 29A is a perspective drawing of a dual-port capacitor structure according to a twenty-eighth embodiment of the present invention. The capacitor structure includes two signal electrode plates 2901 and 2903, two extension ground electrode plates 2907 and 2909, a ground electrode plate 2905 and two interconnections 2915 and 2917, wherein the signal electrode plates 2901 and 2903 respectively have an opening 2911 and an opening 2913.

The signal electrode plate 2901, the signal electrode plate 2903, the extension ground electrode plate 2907 and the extension ground electrode plate 2909 together locate on the same plane. The extension ground electrode plates 2907 and 2909 are respectively disposed in the opening 2911 and the opening 2913. In addition, the ground electrode plate 2905 is disposed under the signal electrode plate 2901, and the extension ground electrode plates 2907 and 2909 are electrically connected to the ground electrode plate 2905 respectively through the interconnections 2915 and 2917.

Figure 29B:
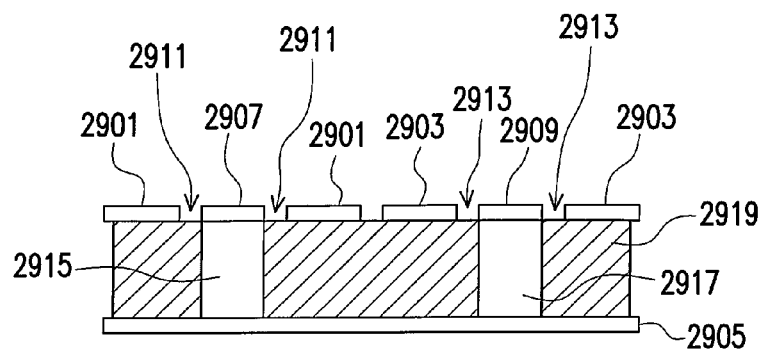
FIG. 29B is a schematic cross section drawing of the dual-port capacitor structure in FIG. 29A according to the twenty-eighth embodiment of the present invention.

FIG. 29B is a schematic cross section drawing of the dual-port capacitor structure along line 15 in FIG. 29A according to the twenty-eighth embodiment of the present invention, wherein a dielectric layer 2919 is disposed between the signal electrode plate 2901 and the ground electrode plate 2905.

Figure 30:
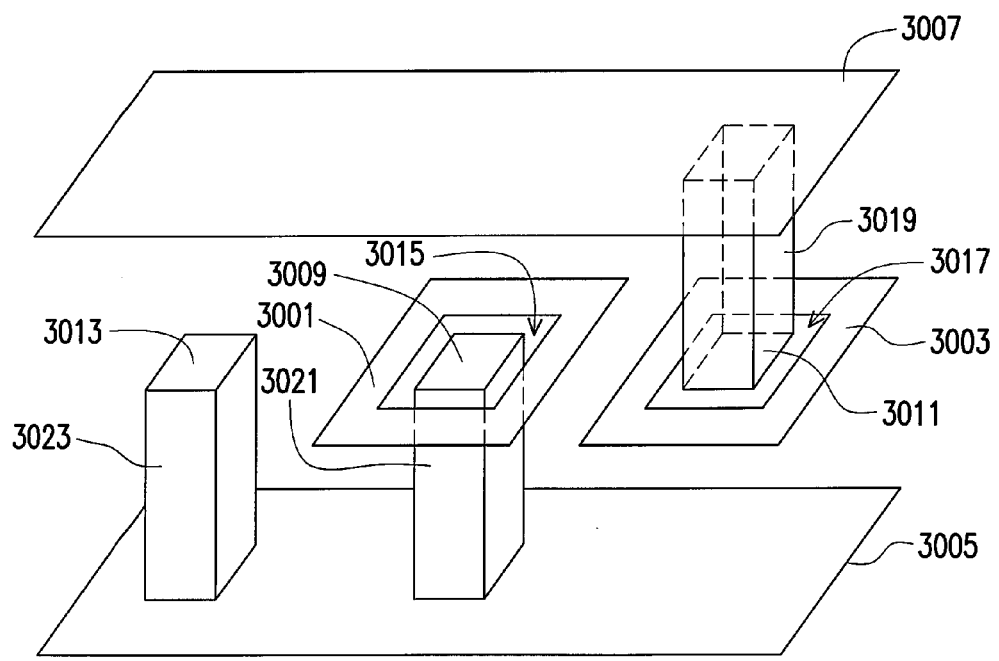
FIG. 30 is a perspective drawing of an embedded multi-layers dual-port capacitor structure according to a twenty-ninth embodiment of the present invention.

FIG. 30 is a perspective drawing of an embedded multi-layers dual-port capacitor structure according to a twenty-ninth embodiment of the present invention. The capacitor structure includes two signal electrode plates 3001 and 3003, three extension ground electrode plates 3009, 3011 and 3013, two ground electrode plates 3005 and 3007 and three interconnections 3019, 3021 and 3023, wherein the signal electrode plates 3001 and 3003 respectively have an opening 3015 and an opening 3017 disposed therein.

The two signal electrode plates 3001 and 3003 and the three extension ground electrode plates 3009, 3011 and 3013 together locate on the same plane. The extension ground electrode plates 3009 and 3011 are respectively disposed at the center of the openings 3015 and 3017, while the extension ground electrode plate 3013 is disposed outside the signal electrode plates 3001 and 3003.

The ground electrode plates 3005 and 3007 are respectively disposed under and over the signal electrode plate 3003. In addition, the extension ground electrode plates 3009 and 3013 are electrically connected to the ground electrode plate 3005 respectively through the interconnections 3021 and 3023, while the extension ground electrode plate 3011 is electrically connected to the ground electrode plate 3007 through the interconnection 3019.

Figure 31:
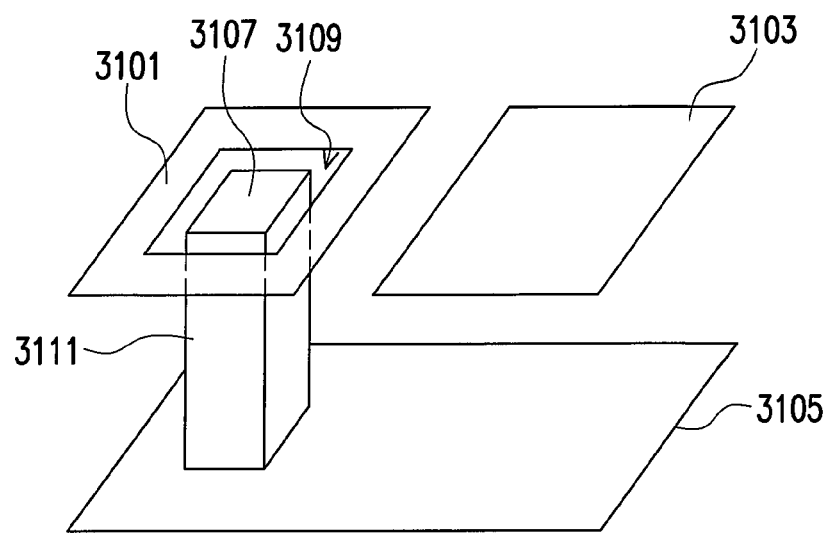
FIG. 31 is a perspective drawing of a dual-port capacitor structure according to a thirtieth embodiment of the present invention.

FIG. 31 is a perspective drawing of a dual-port capacitor structure according to a thirtieth embodiment of the present invention. The capacitor structure includes two signal electrode plates 3101 and 3103, an extension ground electrode plate 3107, a ground electrode plate 3105 and an interconnection 3111, wherein the signal electrode plate 3101 has an opening 3109 disposed therein.

The signal electrode plates 3101 and the extension ground electrode plate 3107 together locate on the same plane. The extension ground electrode plate 3107 is disposed in the opening 3109, while the ground electrode plates 3105 is disposed under the signal electrode plate 3101, so that the ground electrode plate 3105 and the signal electrode plate 3101 do not locate on the same plane. The extension ground electrode plate 3107 is electrically connected to the ground electrode plate 3105 through the interconnection 3111.

Figure 32:
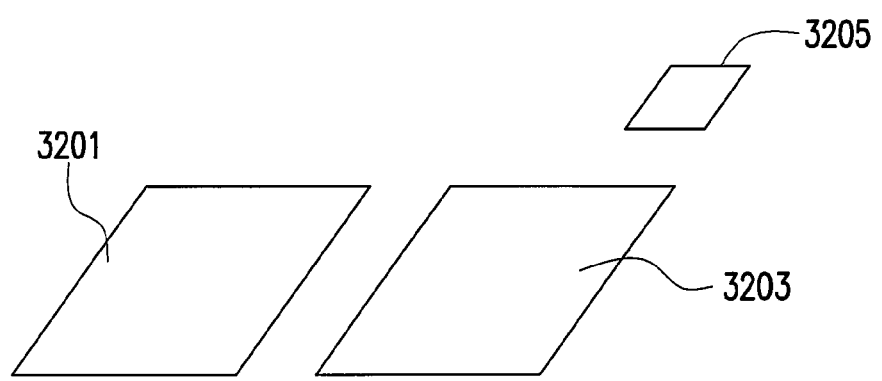
FIG. 32 is a schematic of a dual-port capacitor structure according to a thirty-first embodiment of the present invention.

FIG. 32 is a schematic of a dual-port capacitor structure according to a thirty-first embodiment of the present invention. The capacitor structure includes two signal electrode plates 3201 and 3203 and an extension ground electrode plate 3205. The signal electrode plates 3201 and 3203 and the extension ground electrode plate 3205 together locate on the same plane, and the extension ground electrode plate 3205 is disposed outside the signal electrode plates 3201 and 3203.

Figure 33:
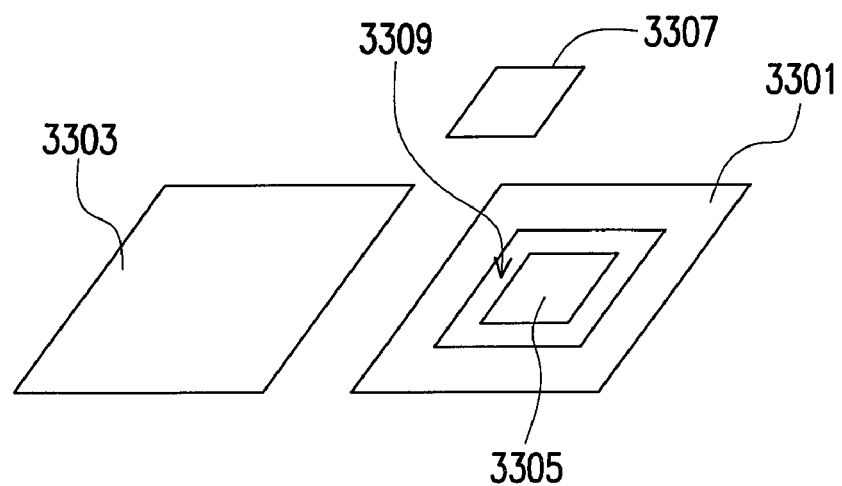
FIG. 33 is a schematic of a dual-port capacitor structure according to a thirty-second embodiment of the present invention.

FIG. 33 is a schematic of a dual-port capacitor structure according to a thirty-second embodiment of the present invention. The capacitor structure includes two signal electrode plates 3301 and 3303 and two extension ground electrode plates 3305 and 3307, wherein the signal electrode plate 3301 has an opening 3309 disposed therein.

The signal electrode plates 3301 and 3303 and the extension ground electrode plates 3305 and 3307 together locate on the same plane, the extension ground electrode plate 3305 is disposed in the opening 3309 and the extension ground electrode plate 3307 is disposed outside the signal electrode plates 3301 and 3303.

Figure 34:
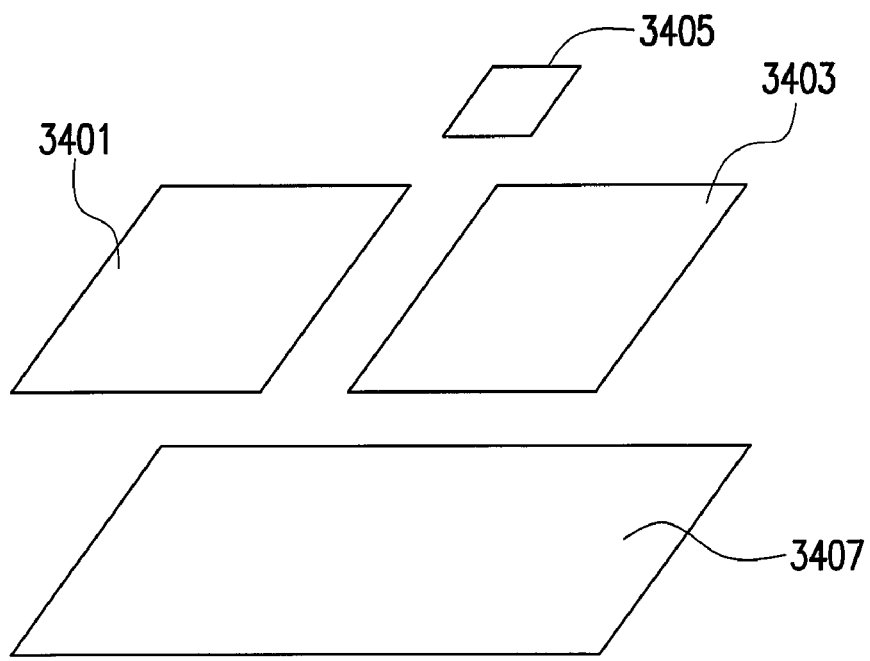
FIG. 34 is a perspective drawing of a dual-port capacitor structure according to a thirty-third embodiment of the present invention.

FIG. 34 is a perspective drawing of a dual-port capacitor structure according to a thirty-third embodiment of the present invention. The capacitor structure includes two signal electrode plates 3401 and 3403, an extension ground electrode plate 3405 and a ground electrode plate 3407. The signal electrode plates 3403 and 3401 and the extension ground electrode plate 3405 together locate on the same plane. The extension ground electrode plate 3405 is disposed outside the signal electrode plates 3401 and 3403, and the ground electrode plate 3407 is disposed under the signal electrode plate 3401.

Figure 35A:
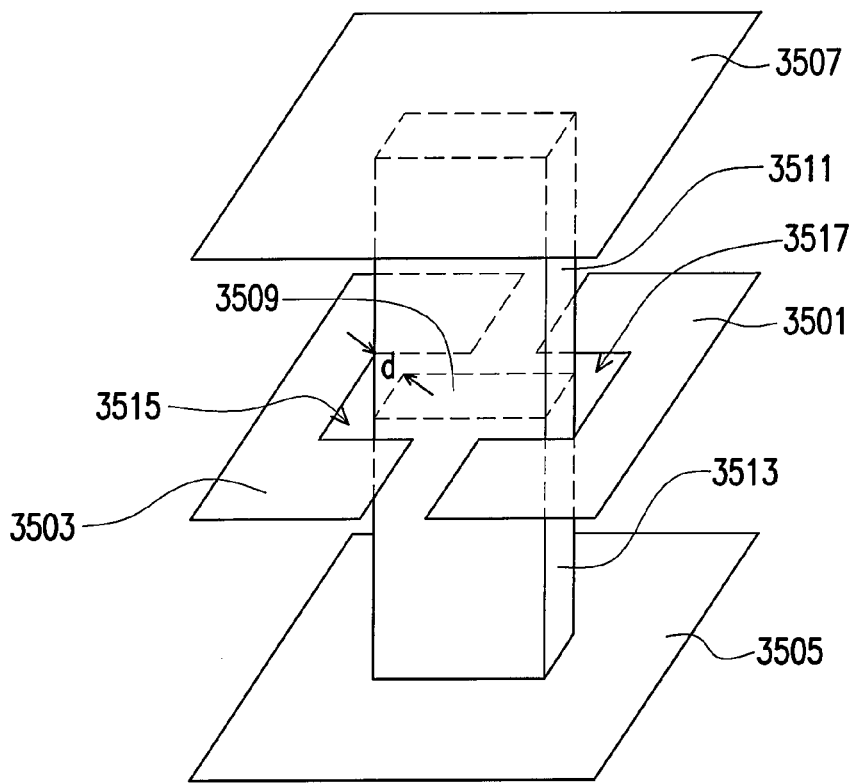
FIG. 35A is a perspective drawing of an embedded multi-layers dual-port capacitor structure according to a thirty-fourth embodiment of the present invention.

FIG. 35A is a perspective drawing of an embedded multi-layers dual-port capacitor structure according to a thirty-fourth embodiment of the present invention. The capacitor structure includes two signal electrode plates 3501 and 3503, an extension ground electrode plate 3509, two ground electrode plates 3505 and 3507 and two interconnections 3511 and 3513, wherein the signal electrode plates 3501 and 3503 respectively have an openings 3517 and an opening 3515 disposed therein.

The signal electrode plates 3501 and 3503 and the extension ground electrode plate 3509 together locate on the same plane. The edge corner of the extension ground electrode plate 3509 is from the edge corners of the openings 3515 and 3517 respectively by a distance parameter d, wherein the distance parameter d is in unit of mil (0.001 inch). In addition, the ground electrode plates 3507 and 3505 are respectively disposed over and under the signal electrode plate 3501, and the ground electrode plate 3509 is electrically connected to the ground electrode plates 3507 and 3505 respectively through the interconnections 3511 and 3513.

Figure 35B:
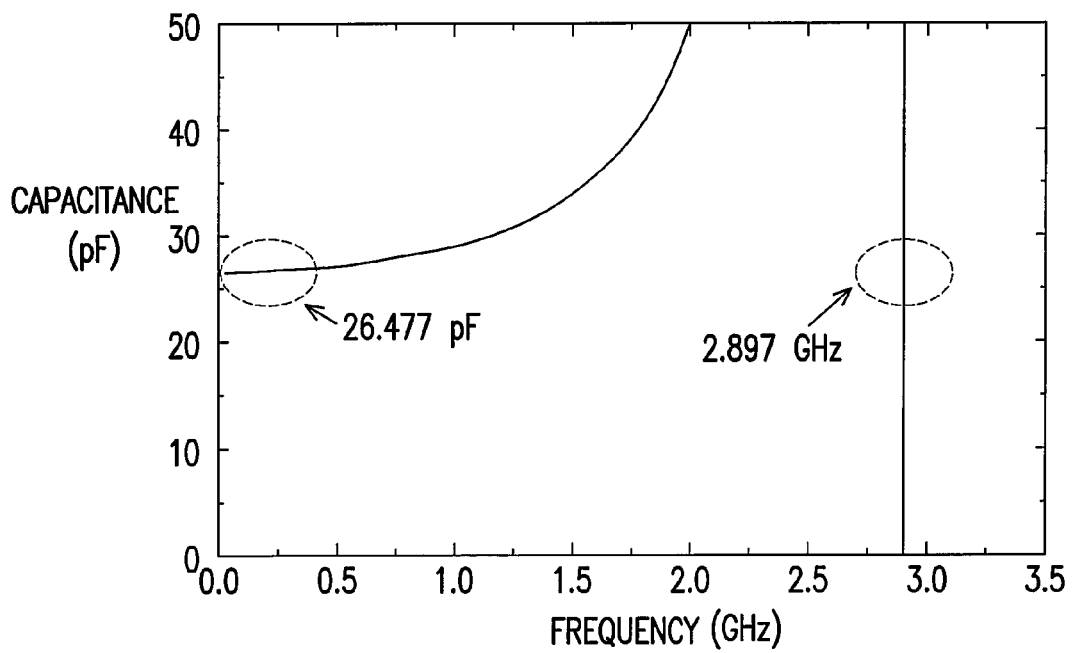
FIG. 35B is a characteristic simulation diagram of the capacitance vs frequency of a conventional embedded multi-layers dual-port plate capacitor.
Figure 35C:
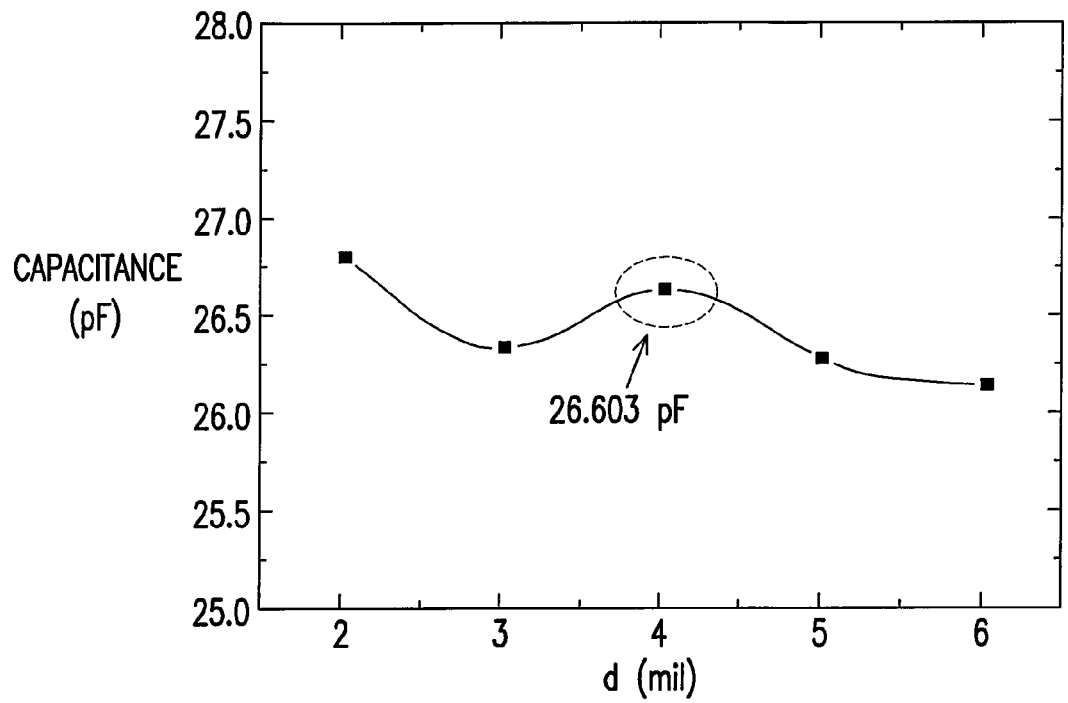
FIG. 35C is a characteristic simulation diagram of the capacitance vs distance parameter of an embedded multi-layers dual-port co-plane capacitor according to a thirty-fourth embodiment of the present invention.
Figure 35D:
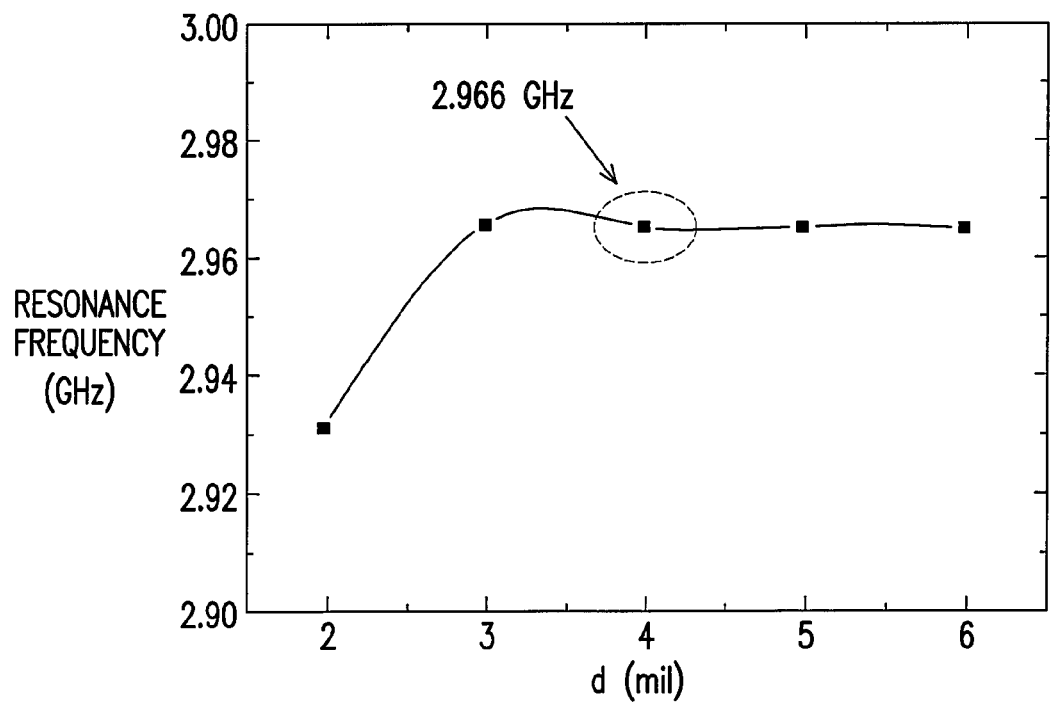
FIG. 35D is a characteristic simulation diagram of the resonance frequency vs distance parameter of the embedded multi-layers dual-port co-plane capacitor according to the thirty-fourth embodiment of the present invention.

FIG. 35B is a characteristic simulation diagram of a conventional embedded multi-layers dual-port plate capacitor, FIG. 35C is a characteristic simulation diagram of the capacitance vs distance parameter d of the embedded multi-layers dual-port co-plane capacitor according to the thirty-fourth embodiment of the present invention and FIG. 35D is a characteristic simulation diagram of the resonance frequency vs distance parameter d of the embedded multi-layers dual-port co-plane capacitor according to the thirty-fourth embodiment of the present invention. Referring to FIGS. 35B-35D, it can be seen that when the distance parameter d=4 mil, the capacitance of the capacitor structure according to the thirty-fourth embodiment of the present invention is near to that of the conventional capacitor structure, but the capacitor structure according to the thirty-fourth embodiment of the present invention has a much higher resonance frequency than that of the conventional capacitor structure.

The relationships between the distance parameter d, the capacitance and the resonance frequency of the embodiment are listed in the following table. In order to compare with the prior art, the corresponding capacitance and resonance frequency of the conventional capacitor structure are included herein as well.

|  | d | | | | | conventional capacitor |
| --- | --- | --- | --- | --- | --- | --- |
|  | 2 | 3 | 4 | 5 | 6 | |
| capacitance (pF) | 26.76 | 26.30 | 26.60 | 26.25 | 26.13 | 26.48 |
| resonance frequency (GHz) | 2.93 | 2.97 | 2.97 | 2.97 | 2.97 | 2.90 |

It can be seen from the above-mentioned table that when the distance parameter d=4 mil, the resonance frequency in the co-plane capacitor structure according to the thirty-fourth embodiment of the present invention gets significantly raised, meanwhile the capacitance remains almost not changed.

Note that in the above-described embodiments, the materials of all the signal electrode plate, the ground electrode plate and the extension ground electrode plate include conductive materials, for example, metal or semiconductor.

In summary, the capacitor structures provided by the above-described embodiments of the present invention are co-plane capacitor structures capable of increasing the resonance frequency of the capacitor device and reducing the parasitic effect thereof. In addition, because electromagnetic wave edge effect may compensate capacitance to solve the problem of reduced capacitor coupling area under a structure change, the provided capacitor structure is also advantageous in high resonance frequency and keeping almost the same capacitance as the conventional structure.

Figure 36:
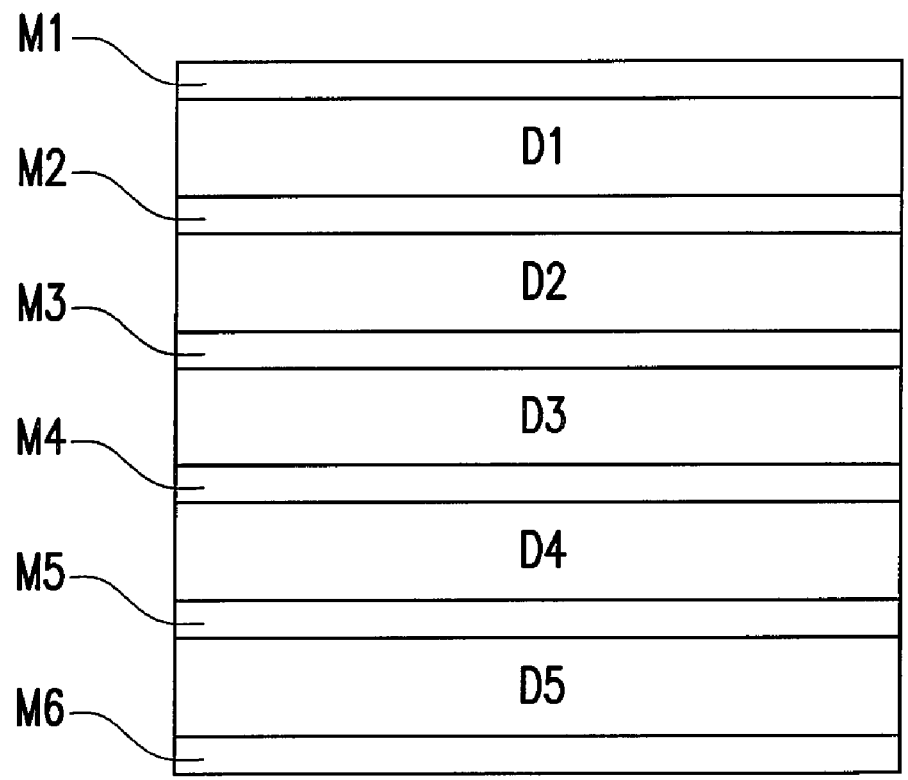
FIG. 36 is a diagram of a substrate structure applicable to the above-mentioned embodiments of the present invention.

FIG. 36 is a diagram of a substrate structure applicable to the above-mentioned embodiments of the present invention, wherein a 6-layers substrate is exemplarily given, however the present invention and the embodiments thereof are not limited thereto. A substrate with more or less layers is allowed to be used. The substrate 3600 herein includes metal layers M1-M6 and dielectric layers D1-D5. The capacitor architecture in the above-described embodiments may be implemented by using any two layers of the metal layers M1-M6, in particular, the selected two layers are not necessarily to be adjacent to each other. For example, the metal layers M2 and M5 are able to be used for implementing the capacitor structure of the above-described embodiments. The capacitor structure is allowed to be implemented by two surface layers (by using the metal layers M1 and M6), and to be embedded in the substrate 3600 as well (by using the metal layers M2-M5).

The material of the substrate (i.e. the material of the dielectric layers D1-D5) includes polyimide, BT resin polymer, glass fiber, material with high dielectric coefficient (with a dielectric coefficient between 80 and 150), aluminium oxide, LTCC (low-temperature cofired ceramics) and ceramic material.

In addition, the above-described embodiments of the present invention are applicable to various fields, such as printed circuit board (PCB) field, integrated circuit (IC) substrate field, integrated circuit (IC) process field and LTCC (low-temperature cofired ceramics) process field.

The above described are preferred embodiments of the present invention only, which do not limit the implementation scope of the present invention. It will be apparent to those skilled in the art that various modifications and equivalent variations can be made to the structure of the present invention without departing from the scope or spirit of the invention. In view of the foregoing, it is intended that the present invention covers modifications and variations of this invention provided they fall within the scope of the following claims and their equivalents.

What is claimed is:

1. A single-port capacitor structure, comprising:
a first electrode plate having an opening;
a second electrode plate, disposed at a side of the first electrode plate, wherein the second electrode plate and the first electrode plate do not locate on the same plane;
a third electrode plate, disposed in the opening of the first electrode plate, wherein the third electrode late and the first electrode late locate on the same plane;
a first interconnection for electrically connecting the second electrode plate and the third electrode plate;
a fourth electrode plate, disposed at another side of the first electrode plate; and
a second interconnection for electrically connecting the third electrode plate and the fourth electrode plate,
wherein the second electrode plate and the fourth electrode plate have solid portions extending over the opening of the first electrode plate, larger in size than the opening of the first electrode plate.

2. The single-port capacitor structure according to claim 1, wherein the first electrode plate further comprises a plurality of openings;
the single-port capacitor structure further comprises:
a plurality of fifth electrode plates, disposed in the openings of the first electrode plate, wherein the fifth electrode plates and the first electrode plate locate on the same plane; and
a plurality of third interconnections for electrically connecting the second electrode plate and the fifth electrode plates.

3. The single-port capacitor structure according to claim 1, further comprising:
at least a sixth electrode plate, disposed outside the first electrode plate, wherein the sixth electrode plate and the first electrode plate locate on the same plane; and
at least a fourth interconnection for electrically connecting the second electrode plate and the sixth electrode plate.

4. The single-port capacitor structure according to claim 2, further comprising:
at least a seventh electrode plate, disposed outside the first electrode plate, wherein the seventh electrode plate and the first electrode plate locate on the same plane; and
at least a fifth interconnection for electrically connecting the second electrode plate and the seventh electrode plate.

5. The single-port capacitor structure according to claim 1, wherein the single-port capacitor structure is applicable to a multilayer substrate, wherein the single-port capacitor structure is located on a surface layer of the multilayer substrate or is embedded in the multilayer substrate;
the material of the multilayer substrate comprises polyimide, BT resin polymer, glass fiber, material with high dielectric coefficient, aluminum oxide, LTCC (low-temperature cofired ceramics) and ceramic material;
the single-port capacitor structure is applicable to printed circuit board (PCB) field, integrated circuit (IC) substrate field, integrated circuit (IC) process field and LTCC (low-temperature cofired ceramics) process field.

6. A single-port capacitor structure, comprising:

a first electrode plate having an opening, wherein the first electrode plate is a signal electrode plate;

a second electrode plate, disposed at a side of the first electrode plate, wherein the second electrode plate and the first electrode plate do not locate on the same plane;

a third electrode plate, disposed in the opening of the first electrode plate, wherein the third electrode plate and the first electrode plate locate on the same plane;

a first interconnection for electrically connecting the second electrode plate and the third electrode plate;

a fourth electrode plate, disposed at another side of the first electrode plate; and a second interconnection for electrically connecting the third electrode plate and the fourth electrode plate, wherein the second electrode plate and the fourth electrode plate are two ground electrode plates.

7. The single-port capacitor structure according to claim 6, wherein the first electrode plate is fully between the third electrode plate and the fourth electrode plate.

* * * * *